(12) United States Patent
Yoon et al.

(10) Patent No.: US 9,994,442 B2
(45) Date of Patent: Jun. 12, 2018

(54) METHOD FOR ARRANGING FINE PARTICLES ON SUBSTRATE BY PHYSICAL PRESSURE

(75) Inventors: Kyung Byung Yoon, Seoul (KR); Nguyen Khanh Nguyen, Seoul (KR); Cao Thanh Tung Pham, Seoul (KR)

(73) Assignee: INDUSTRY-UNIVERSITY COOPERATION FOUNDATION SOGANG UNIVERSITY, Seoul (KR)

( * ) Notice: Subject to any disclaimer, the term of this patent is extended or adjusted under 35 U.S.C. 154(b) by 1137 days.

(21) Appl. No.: 13/263,689

(22) PCT Filed: Apr. 9, 2010

(86) PCT No.: PCT/KR2010/002181
§ 371 (c)(1),
(2), (4) Date: Dec. 19, 2011

(87) PCT Pub. No.: WO2010/117229
PCT Pub. Date: Oct. 14, 2010

(65) Prior Publication Data
US 2012/0100364 A1 Apr. 26, 2012

(30) Foreign Application Priority Data
Apr. 9, 2009 (KR) .................. 10-2009-0030647

(51) Int. Cl.
*B32B 5/16* (2006.01)
*B05D 1/36* (2006.01)
(Continued)

(52) U.S. Cl.
CPC .......... *B81C 1/00373* (2013.01); *B82Y 10/00* (2013.01); *B82Y 30/00* (2013.01);
(Continued)

(58) Field of Classification Search
CPC ..... B81C 1/00373; B82Y 40/00; C30B 29/60; G03F 7/0002
(Continued)

(56) References Cited

U.S. PATENT DOCUMENTS 3,389,655 A  6/1968  Lorenz et al.
4,491,628 A  1/1985  Ito et al.
(Continued)

FOREIGN PATENT DOCUMENTS

JP  2002-045777  2/2002
JP  2003-100211  4/2003
(Continued)

OTHER PUBLICATIONS

T. Kraus et al., "Closing the Gap Between Self-Assembly and Microsystems Using Self-Assembiy, Transfer, and Integration of Particles," Advanced Materials, vol. 17, No. 20, XP055063438, Oct. 17, 2005, pp. 2438-2442.*
(Continued)

*Primary Examiner* — Alexander M Weddle
(74) *Attorney, Agent, or Firm* — Seed IP Law Group LLP

(57) ABSTRACT

Provided is a method of arranging particles on a substrate, the method including: (a) preparing a substrate, a surface of which has depressions or projections capable of fixing the positions and/or orientations of one or more particles; and (b) placing the particles on the substrate and applying a physical pressure to the particles so that a portion or the whole of each particle is inserted in each of pores defined by the depressions or the projections. Provided is also a method of arranging particles on a substrate, the method including: (a) preparing a substrate, at least a surface portion of which has adhesive property; and (b) placing particles, which do not have flat facets but curved surfaces, on the substrate and applying a physical pressure to the particles so that the
(Continued)

particles are immobilized on adhesive surface portions of the substrate.

17 Claims, 22 Drawing Sheets

(51) Int. Cl.

| | |
|---|---|
| *B81C 1/00* | (2006.01) |
| *B82Y 10/00* | (2011.01) |
| *B82Y 30/00* | (2011.01) |
| *B82Y 40/00* | (2011.01) |
| *C30B 5/00* | (2006.01) |
| *C30B 29/60* | (2006.01) |
| *G03F 7/00* | (2006.01) |

(52) U.S. Cl.
CPC ............... *B82Y 40/00* (2013.01); *C30B 5/00* (2013.01); *C30B 29/60* (2013.01); *G03F 7/0002* (2013.01); *Y10T 156/10* (2015.01); *Y10T 428/24851* (2015.01); *Y10T 428/24876* (2015.01); *Y10T 428/24893* (2015.01); *Y10T 428/25* (2015.01)

(58) Field of Classification Search
USPC ......................................................... 427/201
See application file for complete search history.

(56) References Cited

U.S. PATENT DOCUMENTS

| | | | | |
|---|---|---|---|---|
| 4,794,020 | A | * | 12/1988 | Lussi et al. ................... 427/195 |
| 5,206,317 | A | | 4/1993 | Hertler et al. |
| 5,468,589 | A | | 11/1995 | Urano et al. |
| 5,492,793 | A | | 2/1996 | Breyta et al. |
| 5,679,495 | A | | 10/1997 | Yamachika et al. |
| 5,691,396 | A | | 11/1997 | Takemura et al. |
| 5,731,126 | A | | 3/1998 | Takemura et al. |
| 5,747,622 | A | | 5/1998 | Maeda et al. |
| 5,882,844 | A | | 3/1999 | Tsuchiya et al. |
| 5,985,524 | A | | 11/1999 | Allen et al. |
| 6,028,154 | A | | 2/2000 | Schaedeli et al. |
| 6,042,989 | A | | 3/2000 | Schaedeli et al. |
| 6,146,793 | A | | 11/2000 | Schaedeli et al. |
| 6,165,682 | A | | 12/2000 | Foster et al. |
| 6,284,345 | B1 | * | 9/2001 | Ruoff ................... B81C 99/008 264/297.8 |
| 6,329,125 | B2 | | 12/2001 | Takechi et al. |
| 6,340,734 | B1 | | 1/2002 | Lin et al. |
| 6,379,861 | B1 | | 4/2002 | Tefonas, III et al. |
| 6,487,002 | B1 | | 11/2002 | Biegelsen |
| 6,531,260 | B2 | | 3/2003 | Iwasawa et al. |
| 6,590,010 | B2 | | 7/2003 | Kato et al. |
| 7,520,951 | B1 | | 4/2009 | Wolf et al. |
| 7,776,196 | B2 | | 8/2010 | Fujimoto et al. |
| 2001/0008169 | A1 | | 7/2001 | Connell et al. |
| 2003/0009949 | A1 | * | 1/2003 | Prichard ................ B24D 3/002 51/297 |
| 2004/0053009 | A1 | | 3/2004 | Ozin et al. |
| 2005/0196606 | A1 | | 9/2005 | Ihara et al. |
| 2005/0227590 | A1 | * | 10/2005 | Sung ................... B24D 11/001 451/41 |
| 2008/0160190 | A1 | | 7/2008 | Takeuchi et al. |
| 2008/0292978 | A1 | * | 11/2008 | Lin .......................... G02F 1/167 430/32 |
| 2009/0053129 | A1 | | 2/2009 | Black et al. |
| 2009/0246122 | A1 | | 10/2009 | Yoon et al. |

FOREIGN PATENT DOCUMENTS

| | | |
|---|---|---|
| JP | 2004-269922 A | 9/2004 |
| JP | 2005-538233 A | 12/2005 |
| JP | 2006-030279 | 2/2006 |
| JP | 2007-283161 A | 11/2007 |
| JP | 2008080461 A | 4/2008 |
| KR | 100789661 B1 | 12/2007 |
| WO | 2008/082269 A1 | 7/2008 |

OTHER PUBLICATIONS

Japanese 2nd Office Action issued in JP patent Appln. No. 2012-504622 dated Feb. 18, 2014, 3 pages (without English Translation).
Japanese Office Action issued in JP patent Appln. No. 2012-504622 dated Feb. 26, 2013, 3 pages (without English Translation).
T. Kraus et al., "Closing the Gap Between Self-Assembly and Microsystems Using Self-Assembly, Transfer, and Integration of Particles," Advanced Materials, vol. 17, No. 20, XP055063438, Oct. 17, 2005, pp. 2438-2442.
T. Kraus et al., "Nanoparticle Printing With Single-Particle Resolution," Nature Nanotechnology, vol. 2, No. 9, XP005063629, Sep. 1, 2007, pp. 570-576.
Supplementary European Search Report issued in EP Patent Appln. No. 10761890, dated May 27, 2013, 6 pages.
Garcia-Santamaria et al., "Nanorobotic Manipulation of Microspheres for On-Chip Diamond Architectures," Advanced Materials (2002), vol. 14, No. 16, pp. 1144-1147.
Hoogenboom et al., "Template-Induced Growth of Close-Packed and Non-Close-Packed Colloidal Crystals during Solvent Evaporation," Nano Letters (2004), vol. 4, No. 2, pp. 205-208.
Lopez, "Materials Aspects of Photonic Crystals," Advanced Materials (2003), vol. 15, No. 20, pp. 1679-1704.
Norris et al., "Chemical Approaches to Three-Dimensional Semiconductor Photonic Crystals," Advanced Materials (2001), vol. 13, No. 6, pp. 371-376.
Pileni, "Nanocrystal Self-Assemblies: Fabrication and Collective Properties," Journal of Physical Chemistry B (2001), vol. 105, pp. 3358-3371.
Shipway et al., "Nanoparticle Arrays on Surfaces for Electronic, Optical, and Sensor Applications," ChemPhysChem (2000), vol. 1, No. 1, pp. 19-52.
Stöber et al., "Controlled Growth of Monodisperse Silica Spheres in the Micron Size Range," Journal of Colloid and Interface Science (1968), vol. 26, pp. 62-69.
Van Blaaderen et al., "Template-Directed Colloidal Cystallization," Nature (1997), vol. 385, pp. 321-324.
Velev et al., "Colloidal Crystals as Templates for Porous Materials," Current Opinion in Colloid & Interface Science (2000), vol. 5, pp. 56-63.
Wang, "Structural Analysis of Self-Assembling Nanocrystal Superlattices," Advanced Materials (1998), vol. 10, No. 1, pp. 13-30.
Wong et al., "Colloidal Crystal Films: Advances in Universality and Perfection," Journal of the American Chemical Society (2003), vol. 125, No. 50, pp. 15589-15598.
Xia et al., "Monodispersed Colloidal Spheres: Old Materials with New Applications," Advanced Materials (2000), vol. 12, No. 10, pp. 693-713.
Yin et al., "Template-Assisted Self-Assembly: A Practical Route to Complex Aggregates of Monodispersed Colloids with Well-Defined Sizes, Shapes, and Structures," Journal of the American Chemical Society (2001), vol. 123, No. 36, pp. 8718-8729.
Choi et al., "Fabrication of Ordered Nanostructured Arrays Using Poly(dimethylsiloxane) Replica Molds Based on Three-Dimensional Colloidal Crystals," Adv. Funct. Mater. 19:1594-1600, 2009.
Japanese Office Action, dated Aug. 13, 2013, for corresponding JP Application No. 2012-504621, 5 pages.
Kim et al., "Fabrication and Structural Analysis of Binary Colloidal Crystals with Two-Dimensional Superlattices," Adv. Mater. 17:2501-2505, 2005.
Lee et al., "Patterning a Two-Dimensional Colloidal Crystal by Water-Mediated Particle Transfer Printing," Chem. Mater. 19:5553-5556, 2007.
Supplementary European Search Report, dated May 27, 2013, for corresponding EP Application No. 10 76 1889, 7 pages.

\* cited by examiner

FIG. 2
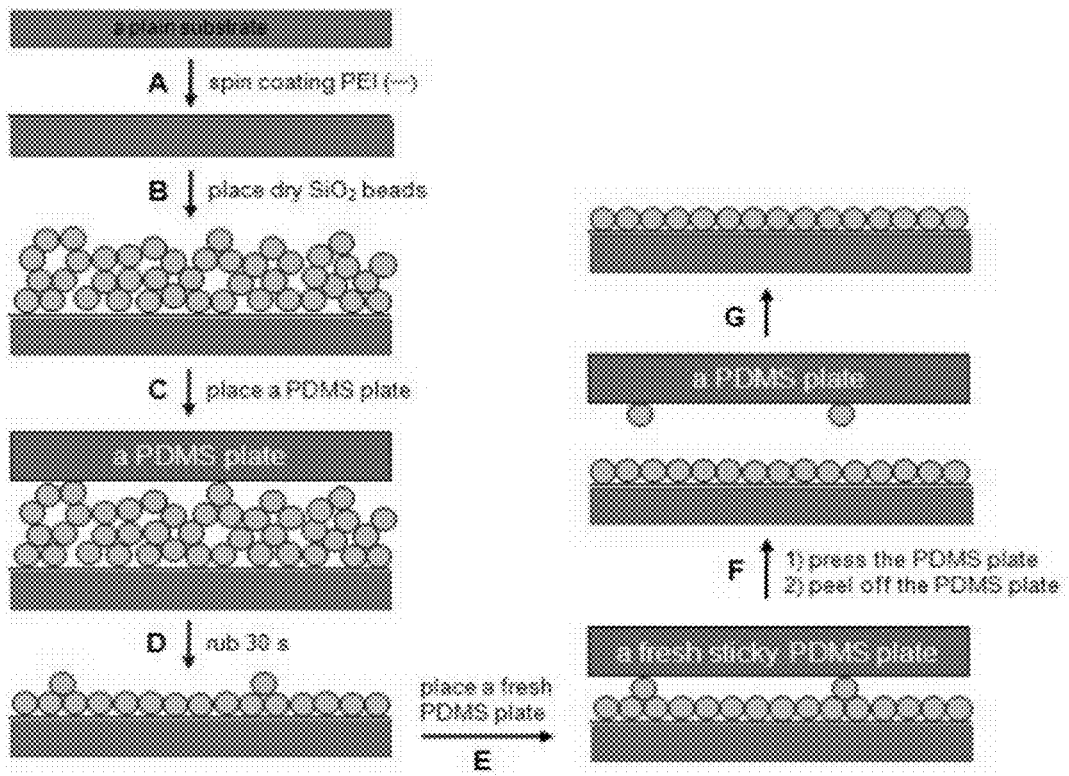
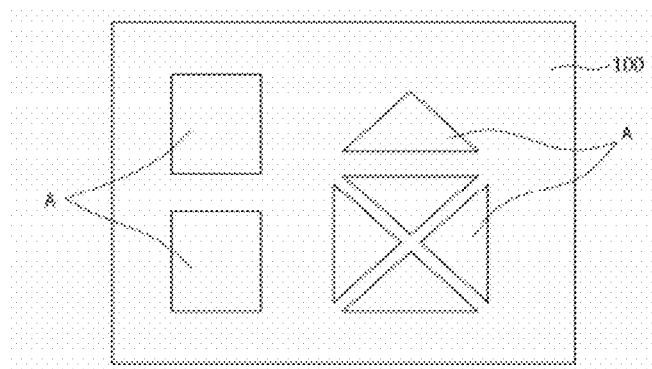

FIG. 18
(a)
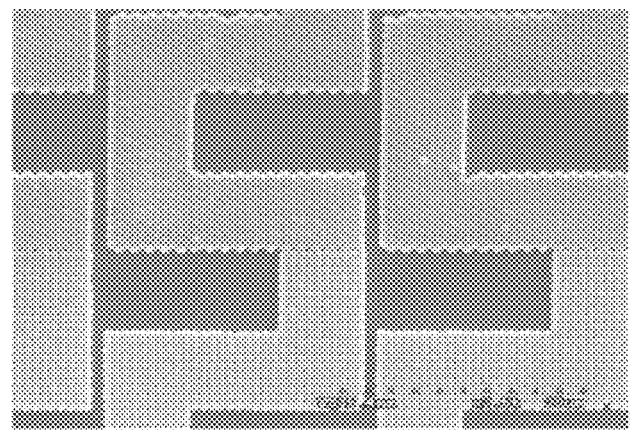
(b)
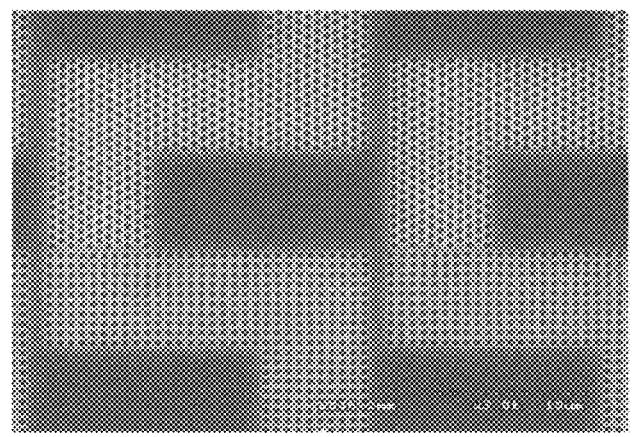
(c)
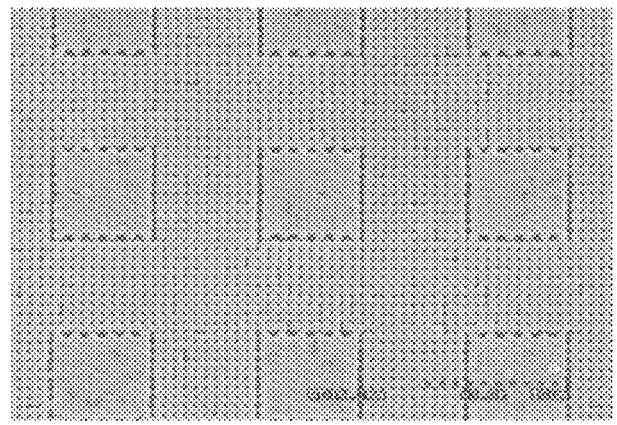

FIG. 23
(a)
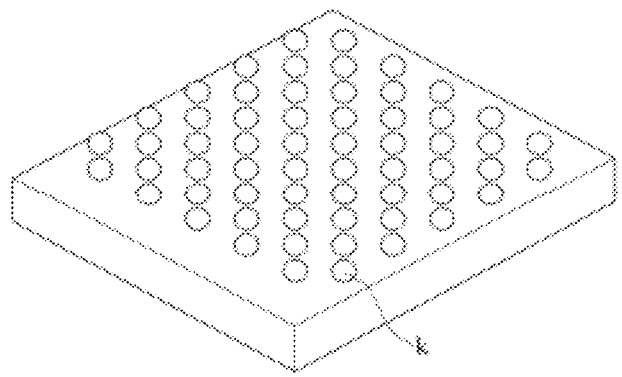
(b)
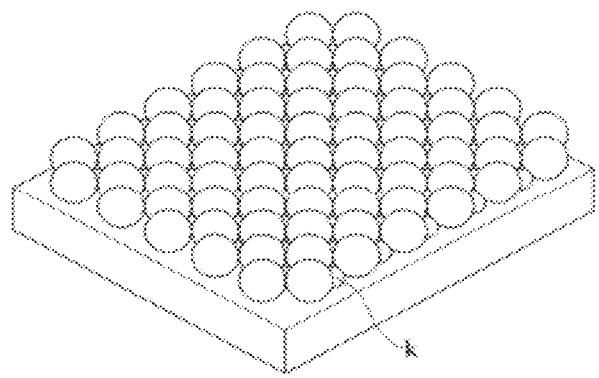
(c)
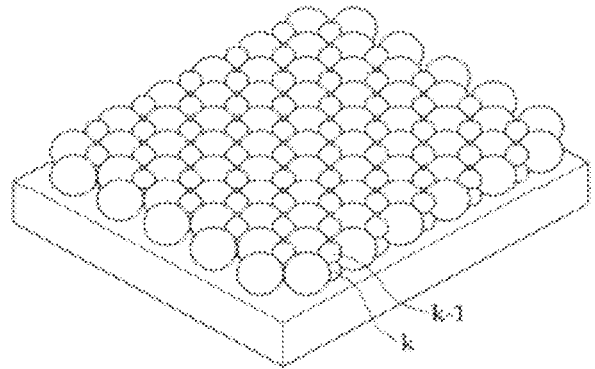

Micro pattern on Silicon wafer

METHOD FOR ARRANGING FINE PARTICLES ON SUBSTRATE BY PHYSICAL PRESSURE

RELATED APPLICATIONS

This application is a 35 U.S.C. § 371 National Phase of International Application No. PCT/KR2010/002181 filed on Apr. 9, 2010, which claims priority to Korean Application No. 10-2009-0030647 filed on Apr. 9, 2009, the disclosure of which is herein incorporated by reference in its entirety.

FIELD OF THE INVENTION

The present invention relates to a method of arranging particles on a substrate using a physical pressure, preferably in the absence of a solvent.

DESCRIPTION OF THE RELATED ART

The organization of particles such as colloidal particles into one-(1D) and two-dimensional (2D) arrays on substrates is an important area in modern science and technology (S. Wong, V. Kitaev, G. A. Ozin, J. Am. Chem. Soc. 2003, 125, 15589; A. N. Shipway, E. Katz, I. Willner, Chem. Phys. Chem. 2000, 1, 18; M. P. Pileni, J. Phys. Chem. B 2001, 105, 3358; Y. Xia, B. Gates, Y. Yin, Y. Lu, Adv. Mater. 2000, 12, 693; C. L, Adv. Mater. 2003, 15, 1679; D. J. Norris, Y. A. Vlasov, Adv. Mater. 2001, 13, 371; Z. L. Wang, Adv. Mater. 1998, 10, 13; O. D. Velev, A. M. Lenhoff, Curr. Opin. Colloid Interface Sci. 2000, 5, 56). For the organization of particles useful for highly precise materials and devices, particles should be arranged as a monolayer in a defect-free, large-scale area ($>mm^2$), and crystal orientation and lattice symmetries of particles should be perfectly controlled. Moreover, from a commercial point of view, particle arrangement should be simple and fast, and the qualities of the arrays should be reproducible. Much effort has been made to meet all of the above requirements, but so far all attempts have been proven inefficient.

The organization of particles with sizes ranging from several nanometers to several hundreds of micrometers into 1D, 2D and three-dimensional (3D) arrays on substrates has been diversely applied in: 1) memory devices, 2) linear and non-linear optical devices, 3) optoelectronic devices, 4) 1D, 2D and 3D photonic crystals, 5) templates for 3D photonic crystals, 6) optical waveguides, 7) grating, 8) photo masks and deposition masks, 9) sensors (chemical, biochemical or medical sensors for molecular detection of antigen-antibody, DNA-DNA, or protein-protein interactions, pH sensors, solvent sensors), 10) light-emitting or electroluminescent illumination devices, 11) dye-sensitized solar cells, thin film solar cells, etc., 12) 1D, 2D, or 3D photonic crystal lasers, 13) decorative or cosmetic color plates, 14) substrates for lap-on-a-chip application, 15) highly hydrophobic or hydrophilic surfaces, 16) porous membranes, 17) mesoporous template materials, 18) membranes used to produce liquid fuels, such as methanol, from carbon dioxide and water using solar light, etc. Thus, array technologies of particles with various properties, dimensions and morphologies into 1D, 2D or 3D structures have been developed.

Conventional methods for arrangement of particles on substrates include spin coating, simple evaporation, dip-and-lift coating, dip-and-lift coating with heating, through-slit dip-and-lift coating, repeated dip-and-lift coating, mobile evaporation coating, slit packing, Langmuir-Blodgett (LB) method, repeated LB method, electrophoresis, sedimentation, etc. However, these methods involve the self-assembly of particles in the presence of a solvent, and thus, many factors should be considered since they may significantly affect the array process. Therefore, the self-assembly of particles in a solution is not suitable for forming defect-free, large-scale monocrystalline arrays.

These methods also have the following problems.

(a) There is a large area of a substrate that is not coated with particles. That is, the surface coverage of particles is 75% or less.

(b) A hexagonal close-packed array area (e.g., a face-centered cubic (fcc) (111) surface) and a random array area coexist in a particle-coated substrate. Generally, the hexagonal close-packed array area is not large.

(c) It is impossible to form a tetragonal close-packed array such as fcc (100) lattice.

(d) It is impossible to form non-close packed, tetragonal and hexagonal monolayers.

(e) In multi-layered structures of particles, the thickness of a particle layer formed on a substrate is not uniform. That is, the thickness of a particle layer is higher at ends of a substrate than at a center portion of the substrate.

(f) The multi-layered structure of particles can exhibit slight 2D ordering of a hexagonal close-packed array. However, such a structure has a combination of an ABABAB array and an ABCABC array, and thus, it is impossible to achieve a perfect 3D array of particles.

(g) It is impossible to form multi-layered structures of regular non-close packed arrays.

(h) Application to a large-scale area is difficult.

(i) An array structure formed by self-assembly may undergo cracking due to particle shrinkage after solvent evaporation.

(j) Precise control of temperature and humidity is required.

(k) In mono-layered structures of particles, many grain boundary defects are found at interfaces of hexagonal close-packed crystals.

(l) When particles with a great particle size distribution are stacked sequentially, array continuity at an interlayer interface is poor, thus making it difficult to form a 3D array of particles.

(m) Further deposition of particles on monolayers occurs frequently, thus, making it difficult to achieve the formation of desired monolayers (LB method, repeated LB method)

(n) Colloidal particles should be positively or negatively charged (electrophoresis).

In this regard, novel methods that do not depend on self-assembly and solvents are required. An example of these methods is a nanorobot method. The nanorobot method is a technique inducing 2D or 3D arrays of particles on a very small surface patterned with nanowells having a diameter of several hundreds of nanometers, in such a way that particles are one-by-one picked and positioned in the nanowells at a very slow speed by nano-sized robot arms provided in a scanning electron microscope (F. Gam, H. T. Miyazaki, A. Urqu, M. Ibisate, M. Belmonte, N. Shinya, F. Meseguer, C. L, Adv. Mater. 2002, 14, 1144). However, the nanorobot method has the following problems: (a) needs for expensive special equipment such as a scanning electron microscope equipped with nano-sized robot arms, (b) formation of 3D array only on a very small area, (c) very slow working speed (at least two minutes are required for positioning one particle), and (d) impracticalness.

In addition, conventional methods employing particle arrangement on a patterned substrate include: i) pattern-induced colloidal crystallization by self-assembly method that a substrate is patterned with circular wells having a uniform pitch, symmetry, and a dimension of several hundreds of nanometers or several micrometers, and particles are organized as 2D or 3D crystal-like arrays in the patterned wells by simple evaporation or dip-and-lift coating; and ii) colloidal crystallization within patterned structures that, when one or more colloidal particles are allowed to flow into each of diversely-shaped patterns such as wells or channels with dimensions of several hundreds of nanometers or several micrometers, formed on a substrate, colloidal particles are organized as crystal-like arrays in the patterns.

The pattern-induced colloidal crystallization by self assembly method has the following problems:

(a) Since particle arrangement depends on mainly patterns of substrates, 1D, 2D and 3D array speeds are very slow.

(b) In 1D array, particles are filled in 1D channels (or trenches), and thus, are densely and uniformly arranged in a channel direction. However, particles in a channel and particles in an adjacent channel cannot form lateral ordering.

(c) In 2D array, particle coverage on a substrate is less than 100%.

(d) That is, it is impossible to form perfect 2D tetragonal or hexagonal close-packed arrays with 100% particle coverage.

(e) In square nanowells, 3D stacking is achieved in only predetermined patterns with proviso that a particle size (d) and a side length (a) of a nanowell satisfy the requirement of $0.7a < d \leq a$.

(f) In case of (e), only less than 40% of patterns formed on a substrate are responsible for forming 3D arrays.

(g) Thus, when a particle size (d) is 70% or less of or greater than a side length (a) of a nanowell ($a < d \leq 0.7a$), 2D and 3D arrays may not be formed in predetermined patterns.

(h) In circular wells, 2D tetragonal and hexagonal close-packed arrays are not formed.

(i) In circular wells, particles enter spontaneously into the wells only when a particle size is slightly or much smaller than the diameter of a well. If a particle size is greater than the diameter of a well, it is impossible to form 1D, 2D and 3D, close-packed or non-close packed arrays in predetermined patterns.

(j) Particle arrays formed by self assembly may undergo cracking after solvent evaporation due to particle shrinkage.

The colloidal crystallization within patterned structure also has the following problems: (a) particles are arranged in patterned wells or channels only by self assembly, (b) many defects are formed, (c) a working speed is slow, (d) much solvents are needed, (e) application to a large-scale area is difficult, (f) particle arrays formed by self assembly may undergo cracking after solvent evaporation due to particle shrinkage, and (g) precise control of temperature and humidity is required.

Many papers and patent documents are referred and cited throughout the specification. The disclosures thereof are incorporated herein in their entireties by reference so that the disclosure of the invention will be thorough and complete and will fully convey the scope of the invention to those skilled in the art.

PRIOR ART

Patent Document

Korean Patent No. 789661

DISCLOSURE OF THE INVENTION

Object of the Invention

The present inventors filed an application of a method of preparing a substrate-molecular sieve composite using a rubbing process, and the application was registered as Korean Patent No. 789661. The patent document exemplifies the use of flat materials with no nanopatterns (e.g., glass plate) as substrates and zeolite with flat facets as molecular sieves.

Unlike the patent document, the present inventors have experimentally found that when particles (e.g., silica beads), which do not have flat facets but curved surfaces, are placed on a substrate, at least a surface portion of which has an adhesive property (e.g., a glass plate coated with polyethyleneimine), and a physical pressure such as rubbing is applied thereto, the particles can be organized as hexagonal close-packed monolayer arrays on adhesive portions of the substrate, even though an adhesion force between the particles and the substrate is decreased due to a decreased contact area between the particles and the substrate (FIGS. 6 to 8).

The present inventors have also found that when particles are placed on a substrate having depressions (e.g., nanowells) or projections (e.g., pillars) capable of fixing the position(s) and/or orientation(s) of one or more particles (e.g., spherical colloidal particles, non-spherical zeolite) and a physical pressure such as rubbing is applied thereto, a portion or the whole of each particle can be inserted into each of pores defined by the depressions or projections, and thus, when the depressions and/or the projections are patterned in a predetermined form, perfect, large-scale (>cm$^2$), 1D and/or 2D particle arrays can be rapidly formed in an arrangement manner corresponding to the patterns, regardless of the sizes and/or shapes of the particles (FIGS. 9 to 31).

The present invention has been completed based on the above findings.

TECHNICAL GOAL OF THE INVENTION

The present invention provides a method of arranging particles on a substrate, the method including: (a) preparing a substrate, a surface of which has depressions or projections capable of fixing the positions and/or orientations of one or more particles; and (b) placing particles on the substrate and applying a physical pressure to the particles so that a portion or the whole of each particle is inserted in each of pores defined by the depressions or the projections (hereinafter, referred to simply as "first method" for brevity of explanation) (see FIG. 1).

The present invention also provides a method of arranging particles on a substrate, the method including: (a) preparing a substrate, at least a surface portion of which has adhesive property; and (b) placing particles, which do not have flat facets but curved surfaces, on the substrate and applying a physical pressure to the particles so that the particles are immobilized on adhesive surface portions of the substrate (hereinafter, referred to simply as "second method" for brevity of explanation) (see FIG. 2(a)).

The present invention also provides an assembly including particles arranged on a substrate, manufactured by the above-described first or second method.

When a mixture of two or more kinds of particles different in particle size and/or shape is used, the first method may further include separating particles corresponding to the size and/or shape of the pores and the other particles.

The first method may further include modifying exposed portions of the particles present in the pores.

Hereinafter, the present invention will be described in detail.

The present invention is characterized in that particles are arranged on a substrate by a physical pressure such as rubbing so that the self-assembly of particles in solvents does not occur, unlike conventional particle array methods requiring the self-assembly of particles in solvents.

Thus, the inventive methods do not require the precise control of temperature and humidity necessary for the self-assembly of particles in solvents. Also, particles can be rapidly moved in a desired direction on a substrate, and thus, the movement of the particles on the substrate is not affected by surface characteristics (e.g., hydrophobicity, charge, roughness).

Furthermore, conventional methods employing particles dispersed in solvents have problems in that the capillary action of solvents leads to poor insertion of particles into pores, thus resulting in coexistence of pores filled and non-filled with particles. In view of the problems, in the present invention, particles are inserted in pores by a physical pressure, thus enabling the insertion of particles in all the pores.

In addition, according to the inventive methods, when arranging particles on a patterned substrate, the sizes and shapes of the particles have higher tolerance for particle size and shape, as compared to conventional self-assembly methods (FIG. 19(d), (e), (f)).

In the inventive methods, the physical pressure can be applied by rubbing or pressing against a substrate. Preferably, a pressurization member is disposed on a substrate coated with particles in such a way to be parallel to a surface of the substrate. In this state, when the reciprocating movement of the pressurization member on the substrate is performed once or more, a physical pressure is applied to the particles.

Non-limiting examples of the pressurization member include bare hand; rubber-gloved hand; elastic materials such as natural or synthetic rubber plates with various geometrical shapes, plastic plates, or PDMS plates; glass plates; silicone wafers; etc.

The inventive methods may further include removing residual particles that are not immobilized on the substrate, using an adhesive member, after step (b) (FIGS. 1, 2(a), 5).

<Substrate>

One of the important features of the present invention resides in the use of various substrates. Preferably, the substrate as used herein includes a flat substrate, an irregular substrate, a substrate on which an adhesive is coated in a predetermined pattern or shape (FIG. 2(b)), or a patterned substrate in which depressions or projections are formed. The substrate may be a plate, a roller, or a support.

The substrate as used herein may be any solid substrate known in the art. Non-limiting examples of the substrate are as follows:

1. Surface hydroxy-containing oxide materials including at least one of metals such as silicon, aluminum, titanium, tin and indium, and non-metallic elements, for example, conductive glasses such as quartz, mica, glass, ITO (indium tin oxide) glass (ITO-deposited glass), or tin oxide ($SnO_2$), fused silica, amorphous silica, porous silica, alumina, porous alumina, crystallized quartz, sapphire, titanium dioxide, porous titanium dioxide, silicone wafer, etc.;

2. Thiol (—SH) or amine (—$NH_2$) group-bondable metals such as gold, silver, copper, and platinum, and metals such as nickel and stainless steel;

3. Variously functionalized polymers, e.g., surface-functionalized polyvinylchloride (PVC), Merrifield peptide resin, polystyrene, polyester, polydimethylsiloxane (PDMS), (+) or (−) PR (photoresist), PMMA (poly(methyl methacrylate)) and acrylics;

4. Semiconductors such as zinc selenide (ZnSe), gallium arsenide (GaAs), and indium phosphide (InP);

5. Natural or synthetic zeolites and their pseudo porous molecular sieves; and

6. Surface hydroxy-containing natural, synthetic or conductive polymers such as cellulose, starch (amylase and amylopectin), and lignin.

The substrate may be a silicone wafer or a fused silica wafer, more preferably a patterned PR-coated fused silica or silicone wafer.

The area of the substrate as used herein is not particularly limited. According to the present invention, a particle arrangement can be perfectly achieved over even a large-scale substrate.

<Particles>

Particles may have a particle size ranging from 1 nm to 100 μm, more preferably from 10 nm to 10 μm.

In the inventive first and second methods, the particles to be placed on the substrate may be a powder form in the absence of solvents, or a coated, immersed or dispersed form in a solvent (the volume ratio of the solvent to the particles is 0-10 times, preferably 0~3 times). Preferably, the particles may be a dry powder form in the absence of solvents, or a coated or immersed form in a solvent so that, when physical pressure is applied to the particles, the solvent can function as a lubricant.

When employing a patterned PR-coated substrate, the use of a solvent enables to prevent the scratching of the patterned PR by the particles.

Non-limiting examples of the solvent include water, $C_{1-6}$ lower alcohols, etc.

Non-limiting examples of the particles include organic polymers, inorganic polymers, inorganic materials, metal particles, magnetic materials, semiconductors, biomaterials, etc.

Examples of polymer particles include, but are not limited to, polystyrene, polymethylmethacrylate (PMMA), polyacrylate, polyalphamethylstyrene, polybenzylmethacrylate, polyphenylmethacrylate, polydiphenylmethacrylate, polycyclohexylmethacrylate, styrene-acrylonitrile copolymers, styrene-methylmethacrylate copolymers, etc.

Examples of inorganic particles include, but are not limited to, titanium oxide, zinc oxide, cerium oxide, tin oxide, thallium oxide, barium oxide, aluminum oxide, yttrium oxide, zirconium oxide, copper oxide, nickel oxide, silica, etc.

Examples of metal particles include, but are not limited to, gold, silver, copper, platinum, aluminum, zinc, cerium, thallium, barium, yttrium, zirconium, tin, titanium, cadmium, iron, alloys thereof, etc.

Examples of semiconductor particles include, but are not limited to, single element semiconductor (e.g., Si, Ge), compound semiconductor (e.g., AlP, AlAs, AlSb, GaN, GaP, GaAs, GaSb, InP, InAs, InSb), etc.

Another examples of the particles include, but are not limited to, crystalline and non-crystalline, binary and multicomponent main group metal and transition metal chalcogenides such as $SiO_2$, $TiO_2$, ITO and $Al_2O_3$; among the chalcogenides, a composite of two or more materials forming core/shell, core/first shell/second shell, or various other structures; a composite of a fluorescent core material and a shell material surrounding the cores; a composite of two or more materials forming a layered structure such as onion; fluorescent materials wherein organic, inorganic or organic/inorganic fluorescent molecules are uniformly or non-uniformly distributed in organic or inorganic particles; particles having magnetic, diamagnetic, paramagnetic, ferroelectric, ferrielectric, super-conductive, conductive, semiconductive, or nonconductive property.

Examples of biomaterial particles include, but are not limited to, proteins, peptides, DNAs, RNAs, polysaccharides, oligosaccharides, lipids, cells, and combinations thereof.

The particles may be symmetric, asymmetric, or amorphous. Non-limiting examples of particle shapes include sphere, hemisphere, cube, tetrahedron, pentahedron, hexahedron, rectangular parallelepiped, octahedron, Y-shape, pillar shape, horn-shape, etc.

The particles may be porous or non-porous.

The particles may be inorganic materials, particularly preferably non-porous inorganic materials unlike porous molecular sieves such as zeolite.

The particles may be particles with curved surfaces, instead of flat facets. Preferably, the particles may be spherical.

The substrate and the particles may form a hydrogen bond, an ionic bond, a covalent bond, a coordinate covalent bond, or a van der Waals interaction, through the physical pressure. Hydrogen bond and ionic bond are preferred, hydrogen bond is more preferred.

Depressions (see 101 of FIGS. 3, 4) and projections present on a surface of the substrate can be formed by direct printing such as lithography, laser beam, or etching; printing using positive or negative PR; laser ablation after coating a sacrificial layer; or inkjet printing.

Pores defined by the depressions or the projections may have a pore size ranging from 1 to 100,000 nm, preferably from 5 to 5,000 nm, more preferably from 5 to 1,000 nm.

Non-limiting examples of the shapes of the depressions and the projections include nanowells, nanodots, nanopillars, nanotrenchs, nanocones, etc. (FIG. 9(a), (b), (c)).

As used herein, the size of pores defined by depressions or projections refers to a diameter (in case of nanowells and nanopillars), and a bottom diameter (in case of nanocones). The depth/height of a pore may range from 1 nm to 10000 μm. The bottom of a pore may be flat, gently sloped or curved.

The pores defined by depressions or projections may have shapes corresponding to the shapes of predetermined portions of the particles to be inserted in the pores so that the particles are oriented in predetermined directions (FIGS. 3, 4(b), 25-30).

By adjusting a pore size and/or a particle size, one particle or two or more particles can be inserted in each pore, and the same number of particles can be inserted in each pore (FIG. 19).

In case of inserting two or more particles in each pore, each pore may have a shape corresponding to an outer shape defined by the two or more particles so that the two or more particles are inserted in each pore, preferably in a desired orientation (FIGS. 4(a), (b), 21).

When depressions or projections are directly formed on a substrate or when depressions or projections are formed on a coating layer disposed on a substrate, if a substrate material and a coating layer material are not rigid but are elastic to some degree, even though a maximal size of each pore defined by the depressions or the projections is smaller than the entire maximal size of one or more particles inserted simultaneously in each pore, the particles can be inserted into each pore by physical pressure. In this case, the particles and/or the pores may undergo deformation after the particle insertion (FIG. 19(d), (e), (f)).

The cross-sectional shape of depressions and the projections may be a circle; a polygon such as triangle, square, pentagon, hexagon, heptagon, octagon, nonagon, decagon, trapezoid, rhombus, and parallelogram; a complex shape such as oval, half moon, crescent, flower and star; or a geometrical shape such as linear or curved trench (FIGS. 9(a), (b), (c), 25). One of the features of the present invention is that, regardless of the shapes of pores defined by depressions or projections, particles can be inserted in almost all the pores and perfectly arranged (FIGS. 9-22, 27-30).

The pores defined by depressions and/or projections formed on a substrate to receive particles may have one or more sizes and/or shapes (FIG. 19(a), (b)). Even when pores with two or more different sizes and/or shapes are formed in a substrate, the insertion of particles in pores is performed by physical pressure, instead of self-assembly in solvents, thus enabling the insertion of particles in almost all the pores.

Each depression 101 of the substrate may have two or more another depressions 102 therein so that the positions and/or orientations of particles in each depression 101 are individually fixed (FIG. 4(a), (b)). Here, the depressions 102 capable of fixing the positions and/or orientations of the particles may have one or more sizes and/or shapes.

A particle inserted in a pore and another particle inserted in an adjacent pore may be contacted with or separated from each other by adjusting a distance between the pores, thus enabling the close packed or non-close packed arrays of the particles (FIGS. 16, 19(c)).

For example, the shortest diameter of each pore may range from 2 to 1000 nm.

The adjustment of the positions of the pores formed on the substrate enables an arrangement of particles in any pattern such as the tetragonal or hexagonal close-packed array (FIG. 9(a), (b), (c), (d), (e), (f)).

The particles inserted in the pores of the substrate may form predetermined 1D, 2D, or 3D patterns or shapes. Non-limiting examples of such patterns include 1D patterns such as 1D wires or 1D stripes; 2D patterns such as 2D tetragonal net arrays; and 3D patterns such as crystal lattice structures (FIGS. 17 and 18). In this case, the particles may form one or more patterns or shapes (FIGS. 17(d), (e), 18)

The dimensions of patterns formed by the particles are not limited, but each of the length, width and height of a pattern may range from 1 mm to 15 cm, preferably from 5 mm to 5 cm, more preferably from 8 mm to 2 cm.

The particles may form a fcc (100) array, a fcc (111) array, or a combination array on the substrate (FIGS. 17, 18). That is, particles may form the same symmetric array or two or more different symmetric arrays on a single substrate (FIG. 17(d), (e)).

According to the inventive methods, it is possible to easily form the multilayer arrays as well as monolayer arrays of particles. That is, the inventive first and second methods can achieve a monolayer array of particles, and even more, after forming a first monolayer, can achieve further insertion of particles in interstitial spaces defined by adjacent three or more of the particles constituting the first monolayer using a physical pressure to form a second monolayer. When the formation of the second monolayer is performed once or more, two or more-layered particle arrays can be achieved (FIGS. 17, 19(a), (b)).

Here, the particles constituting the first monolayer and the particles inserted in the interstitial spaces defined by adjacent three or more of the particles constituting the first monolayer may be the same or different (FIGS. 17(f), 19(a), (b)). That is, in case of forming two or more-layered arrays of particles, particles constituting adjacent two layers may be the same or different.

When forming two or more-layered arrays of particles, patterns of adjacent two layers may be the same or different.

Moreover, during applying a physical pressure such as rubbing, an adhesive such as PEI may be coated on particles.

The particles and/or the substrate may be surface-coated with an adhesive material (FIGS. 1 and 2). In this case, after step (b), the first and second methods may further include removing the adhesive material coated on the particles and/or the substrate.

Non-limiting examples of the adhesive material include (i) —$NH_2$ group-containing compounds, (ii) —SH group-containing compounds, (iii) —OH group-containing compounds, (iv) polymer electrolytes, (v) polystyrene, (vi) Photo resist, etc.

In case of coating an adhesive material on a surface of a substrate, it is possible to form free-standing particle arrays and patterns on a flat substrate, within a short period, by a simple manner including: forming depressions or projections in predetermined arrays and patterns on an adhesive material covering a substrate (FIG. 16(a), (b)); applying physical pressure to particles so that the particles are inserted in pores defined by the depressions or projections to form predetermined particle arrays or patterns (FIG. 16(c), (d)); and removing the adhesive material (FIG. 16(e), (f)).

The photoresist (PR) may be positive or negative PR. For example, the PR may be PMMA (Polymethylmethacrylate), PMGI (PolyMethylGlutarimide), DNQ/Novolac, or SU-8, as disclosed in U.S. Pat. Nos. 5,492,793, 5,747,622, 5,468,589, 4,491,628, 5,679,495, 6,379,861, 6,329,125, 5,206,317, 6,146,793, 6,165,682, 6,340,734, 6,028,154, 6,042,989, 5,882,844, 5,691,396, 5,731,126, 5,985,524, 6,531,260, and 6,590,010.

The removal of PR on a substrate may be performed by various methods known in the art. For example, the removal of PR may be performed by immersing a PR-coated substrate in a peeling solution or shower-injecting a peeling solution on a substrate. Non-limiting examples of the peeling solution include a strong alkaline solution, dimethylformamide, dimethylacetamide, dimethylsulfoxide, N-methyl-2-pyrrolidone, methanol, etc.

In an assembly including particles arranged on a substrate, manufactured by any one of the above-described inventive methods, a transparent or opaque protecting material may be further coated/filled on surfaces of the particles or on spaces defined by the particles.

Non-limiting examples of the protecting material include PDMS, thermoplastic polymers, conductive polymers, plastics, Nafion, cellulose, meltable metals, silica precursors, titanium dioxide precursors, metal oxide precursors, metal sulfide precursors, etc.

The inventive assembly including the array of the particles on the substrate can be stabilized by coating a natural or synthetic polymer such as a silicon-containing compound, a titanium-containing compound, Nafion, polystyrene, an acrylic resin, and polyalcohol.

The inventive assembly including the array of the particles on the substrate may include an n-layered array of particles (here, n is a natural number of 2 or more) wherein, in adjacent two layers, e.g., a k layer and a k+1 layer (herein, 0<k<n, k is a natural number), particles of the k+1 layer can be vertically arranged on particles of the k layer (FIG. 24).

Such an assembly can be prepared in such a manner that a monolayer (a k layer) of first particles is formed, removable second polymer particles are inserted in pores defined by the first particles constituting the k layer, the first particles are inserted in pores defined by the second polymer particles to form another monolayer (a k+1 layer) of the first particles, and the second polymer particles are removed (FIGS. 23, 24).

That is, the removable polymer particles may be inserted in spaces defined by the particles constituting the k layer and the k+1 layer that are adjacent to each other (FIG. 23(c)).

Moreover, when a mixture of two or more kinds of particles different in particle size and/or shape is used, the inventive first method may further include separating particles corresponding to the size and/or shape of the pores and the other particles.

The inventive first method may further include modifying exposed portions of the particles present in the pores, by a physical treatment, a chemical treatment, or a chemical bond (FIG. 3). In this case, the particles can be positioned in desired orientations by adjusting the shapes of the pores, and thus, the surface modification can be performed on only desired portions of the particles.

Effect of the Invention

According to the inventive methods, an assembly including an array of particles on a substrate can be mass-produced in a short time, and monolayer or multilayer arrays of particles can be achieved on a large-scale substrate. Moreover, assemblies including various arrays of particles on substrates can be produced with the same high quality (good reproducibility).

BRIEF DESCRIPTION OF THE DRAWINGS

FIG. 2(a) is a flow diagram illustrating an embodiment of the second method of the present invention.

FIG. 2(b) is a diagram illustrating a substrate 100 with adhesive surface portions patterned or shaped with an adhesive material A.

Figure 11:
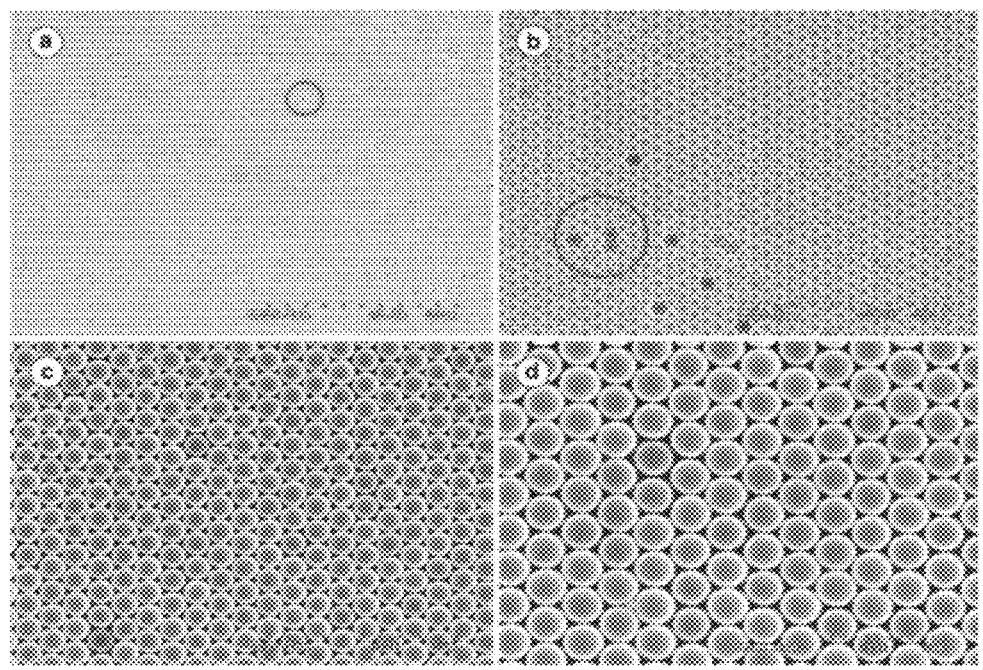
FIG. 11 is SEM images showing 2D fcc (111) arrays of 700 nm sized silica beads on patterned silicone wafers (1 cm×1 cm) (panel (a): 1K magnification; panel (b): 5K magnification; panel (c): 10K magnification; panel (d): 15K magnification). A 0.25% PEI solution was spin-coated on the silicone wafers.
Figure 12:
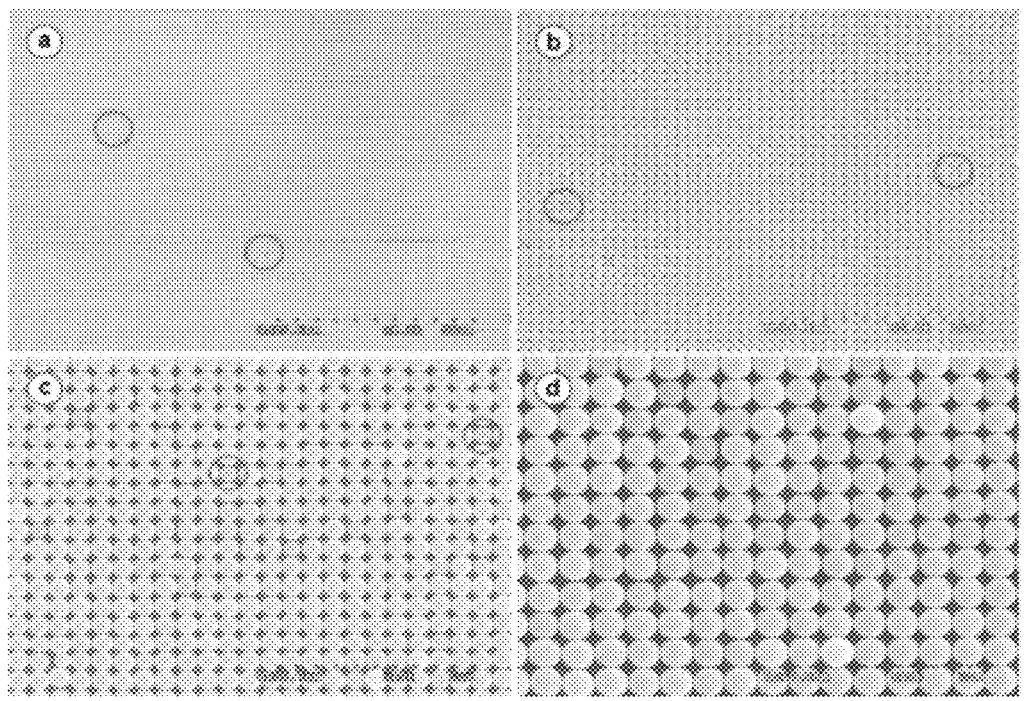
FIG. 12 is SEM images showing 2D fcc (100) arrays of 500 nm sized silica beads on patterned silicone wafers (1 cm×1 cm) (panel (a): 1K magnification; panel (b): 5K magnification; panel (c): 10K magnification; panel (d): 15K magnification). A 0.25% PEI solution was spin-coated on the silicone wafers.
Figure 13:
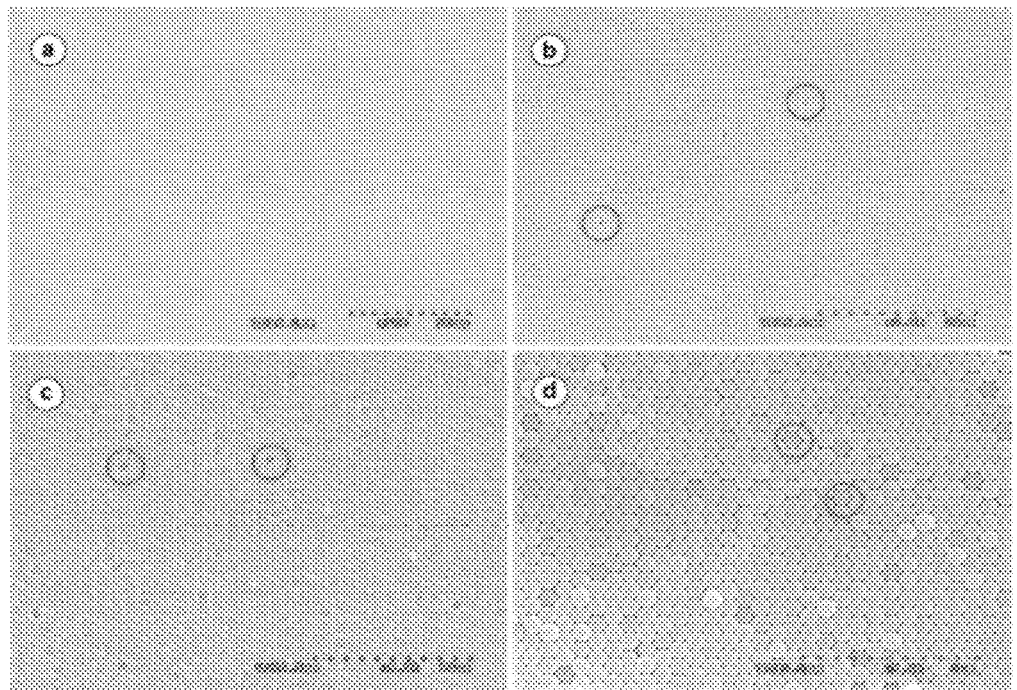
FIG. 13 is SEM images showing 2D fcc (111) arrays of 500 nm sized silica beads on patterned silicone wafers (1 cm×1 cm) (panel (a): 0.6K magnification; panel (b): 2K magnification; panel (c): 4K magnification; panel (d): 9K magnification). A 0.25% PEI solution was spin-coated on the silicone wafers.

In the panels (a) and (b) of FIGS. 11 to 13, black spots (represented by circles) were caused by the presence of smaller sized silica beads on corresponding spots.

Figure 14:
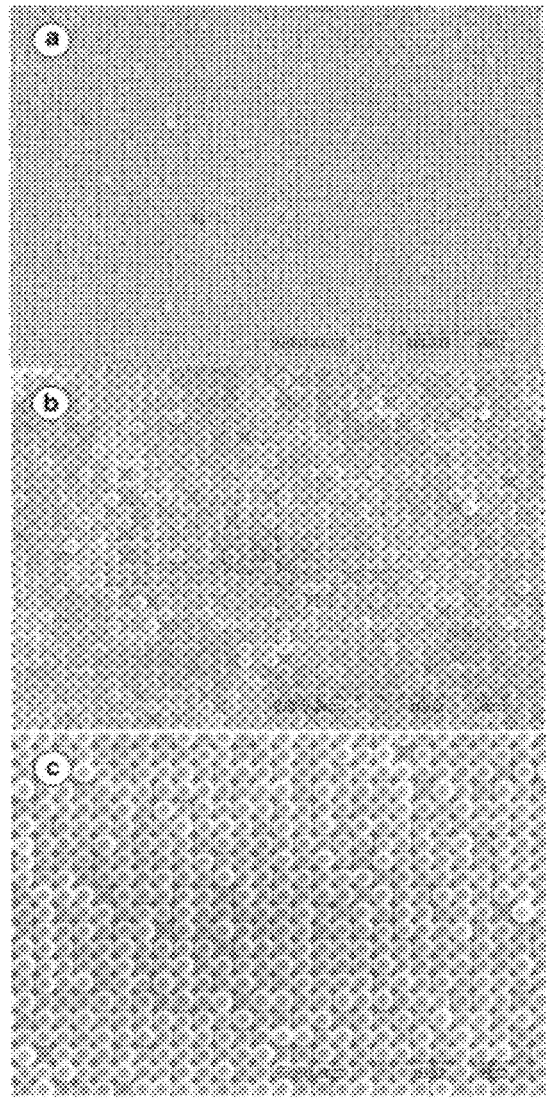

FIG. 14 is SEM images showing 2D fcc (100) arrays of 300 nm sized silica beads on patterned silicone wafers (1 cm×1 cm) (panel (a): 6K magnification; panel (b): 10K magnification; panel (c): 15K magnification).

FIG. 15 is SEM images showing 2D fcc (111) arrays of 300 nm sized silica beads on patterned silicone wafers (1 cm×1 cm) (panel (a): 6K magnification; panel (b): 10K magnification; panel (c): 15K magnification).

FIGS. 16(a) and (b) are SEM images showing silicone wafers coated with PR films of 350 nm in thickness that were patterned with wells of 500 nm in diameter and 700 nm in pitch to form a tetragonal net array (panel (a)) and a hexagonal net array (panel (b)). Panels (c) and (d) are SEM images showing 2D arrays of 700 nm sized silica beads on the silicone wafers of the panels (a) and (b), respectively. Panels (e) and (f) are SEM images showing free-standing, 2D fcc (100) and fcc (111) monolayer arrays, respectively, of 700 nm sized silica beads on flat silicone wafers after PR removal.

Figure 17:
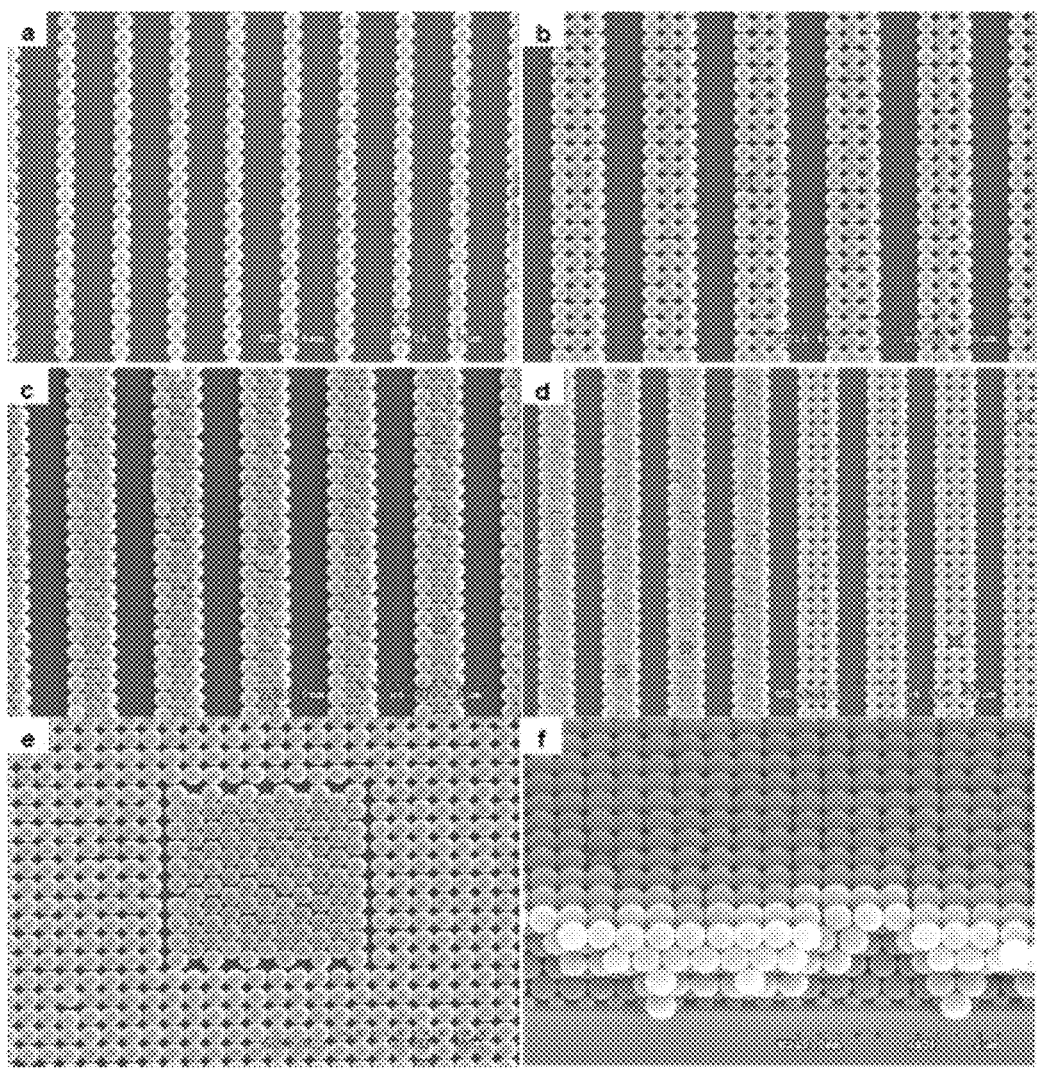

FIG. 17 is SEM images showing 1D, 2D and 3D close-packed arrays of 700 nm sized silica beads on patterned silicone wafers (panel (a): 1D wires; panel (b): 1D fcc (100) stripes; panel (c): 1D fcc (111) stripes; panel (d): a mixed 1D pattern of fcc (100) stripes and fcc (111) stripes; panel (e): a mixed 2D pattern of fcc (100) and fcc (111) arrays; panel (f): a 3D fcc (100) array formed by a layer-by-layer pattern (five layers).

FIG. 18 is SEM images showing diversely patterned arrays of silica beads on silicone wafers.

Figure 19:
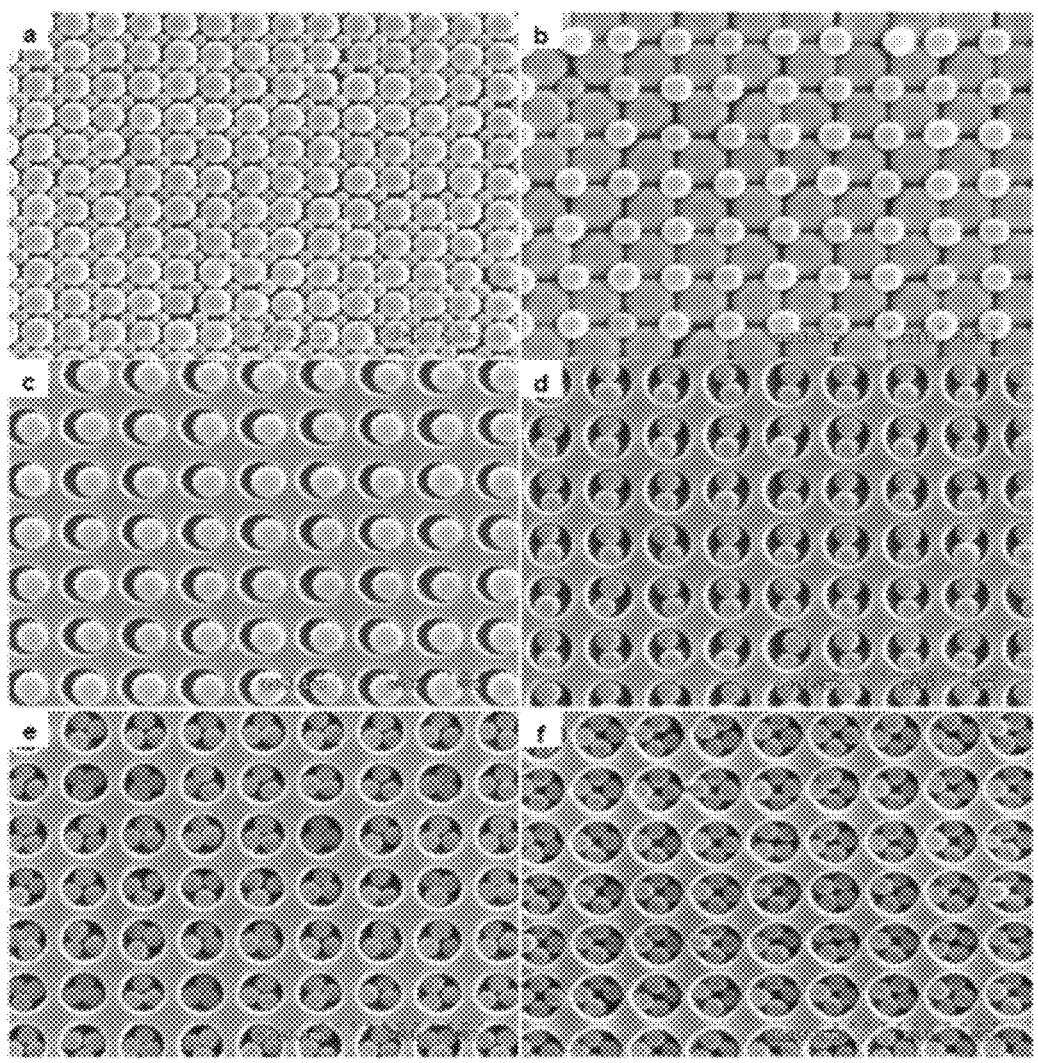

FIG. 19 is SEM images showing binary 2D arrays of 700 nm and 300 nm sized silica beads (panel (a)) and 700 nm and 420 nm sized silica beads (panel (b)); a non-close packed 2D array of 420 nm sized silica beads (panel (c)); a non-close packed 2D array formed by inserting two 300-nm sized silica beads in each pore (panel (d)), a non-close packed 2D array formed by inserting three 250-nm sized silica beads in each pore (panel (e)); and a non-close packed 2D array formed by inserting four 230-nm sized silica beads in each pore (panel (f)). Here, silicone wafers patterned with tetragonal net arrays of nanowells (500 nm in diameter, 250 nm in depth, 700 nm in pitch) were used.

Figure 20:
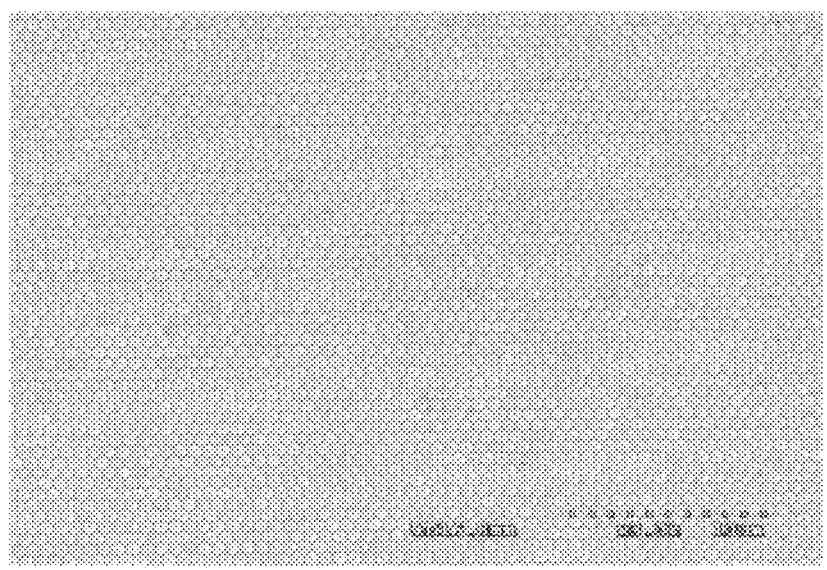

FIG. 20 is a SEM image (3K magnification) showing a non-close packed 2D array of 500 nm sized silica beads on a patterned silicone wafer (1 cm×1 cm).

Figure 21:
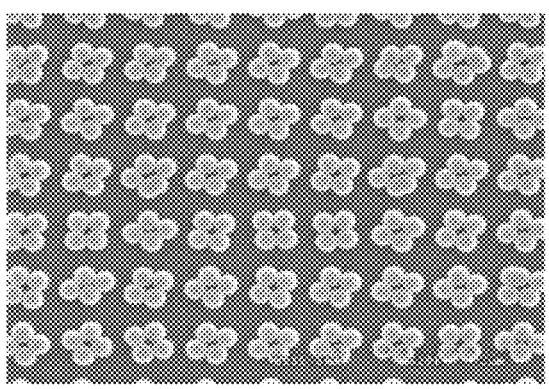
Figure 22:
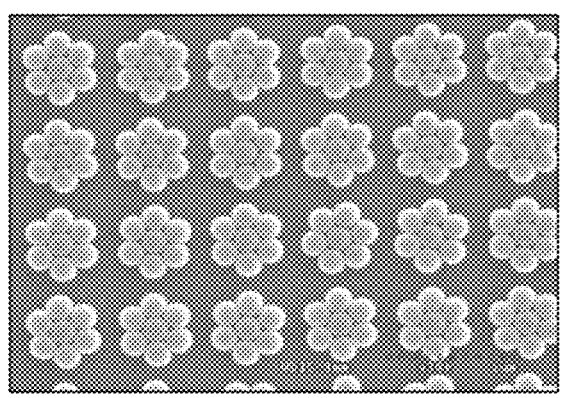

FIGS. 21 and 22 are SEM images showing the insertion of four (FIG. 21) or seven (FIG. 22) silica beads in each depression having a shape corresponding to an outer shape defined by the four or seven silica beads.

FIGS. 23(a), (b) and (c) are diagrams illustrating a process of inserting larger spherical PMMA polymer particles (to be removed later) in spaces defined by first and second monolayers of silica beads to achieve a snowman-like layered array of the silica beads.

Figure 24:
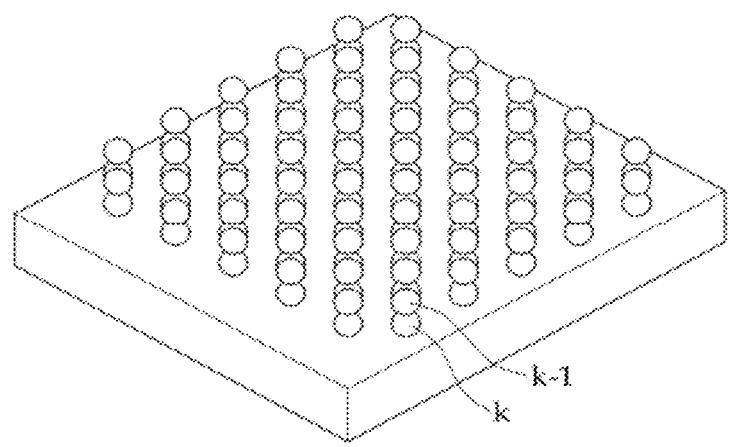

FIG. 24 is a diagram illustrating a snowman-like layered array of the silica beads left after removing the PMMA polymer particles from the diagram of FIG. 23.

Figure 25:
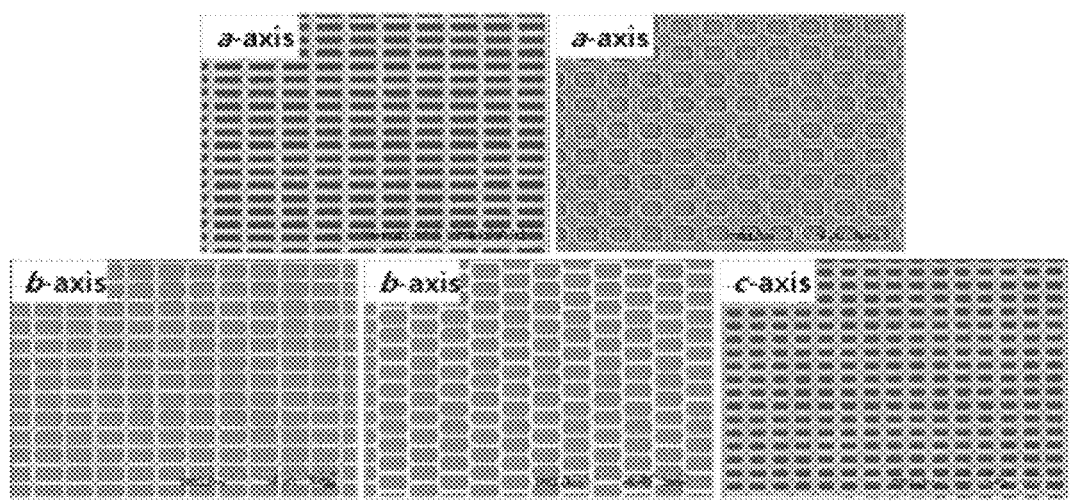

FIG. 25 is SEM images showing silicone wafers negatively patterned with PR in order to receive crystalline silica particles with a-, b- and c-axes in corresponding axis directions.

Figure 26:
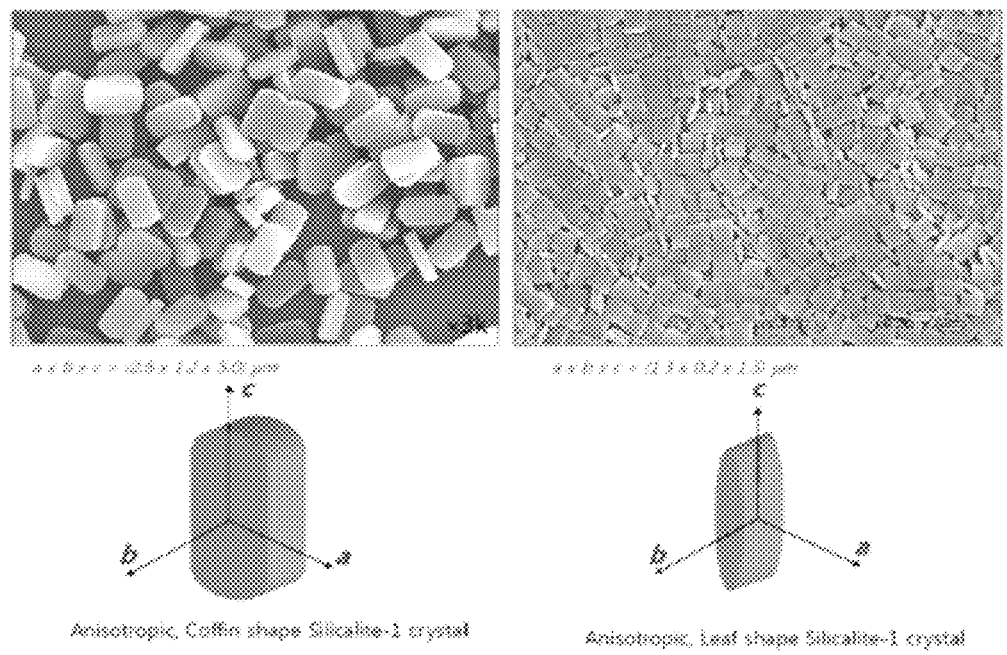
Figure 27:
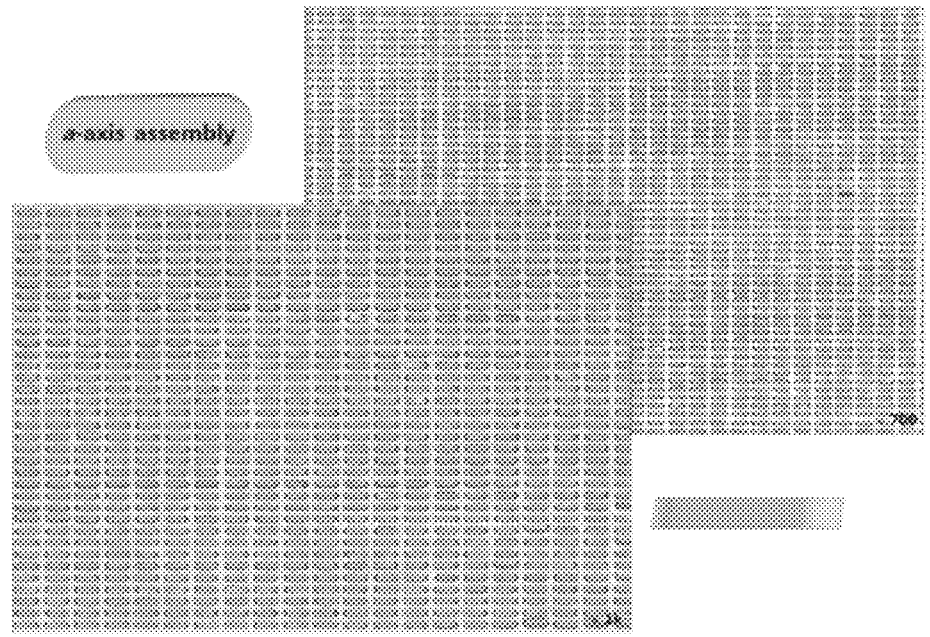
Figure 28:
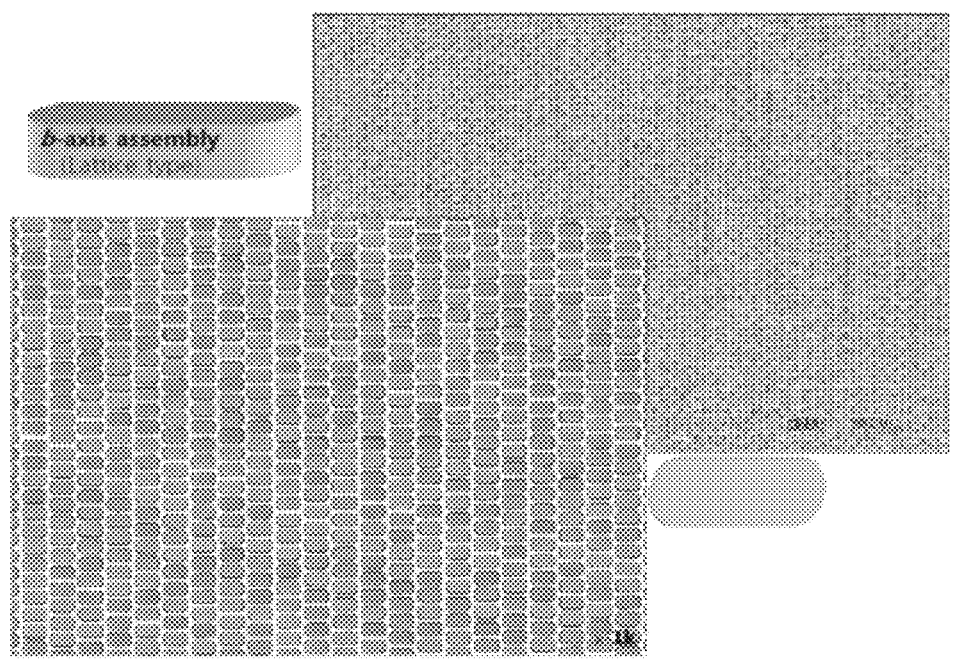
Figure 29:
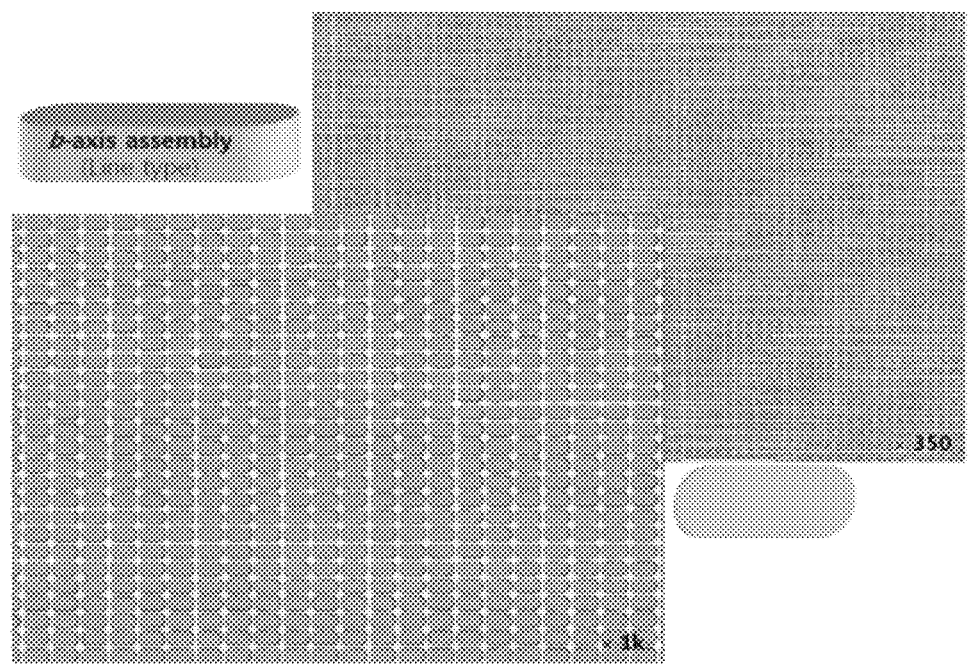
Figure 30:
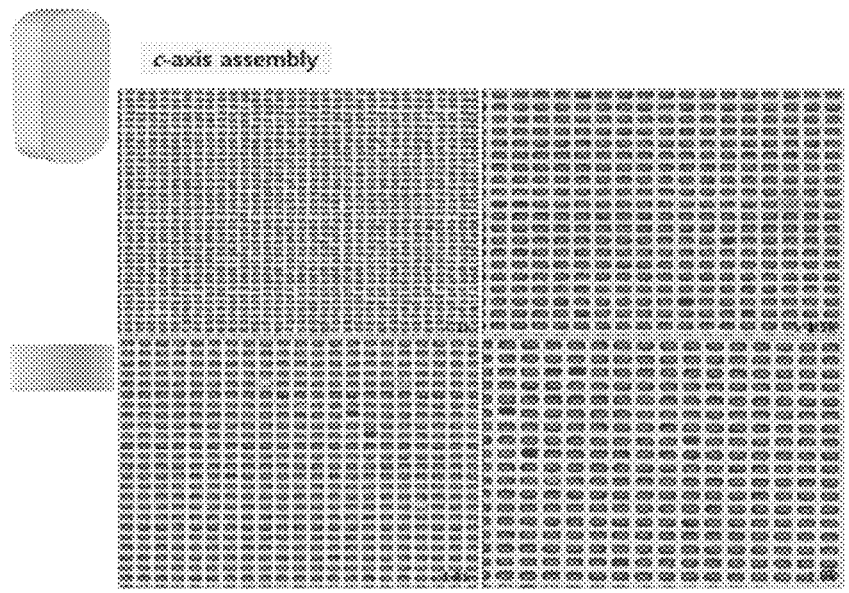

FIG. 26 is SEM images showing anisotropic, coffin shape silicalite-1 crystals and anisotropic leaf shape silicalite-1 crystals; and crystal axes thereof.

FIGS. 27 through 30 are SEM images showing a-, b- and c-axis assemblies of crystalline silica particles with a-, b- and c-axes inserted in silicone wafers negatively patterned with PR as shown in FIG. 25.

Figure 31:
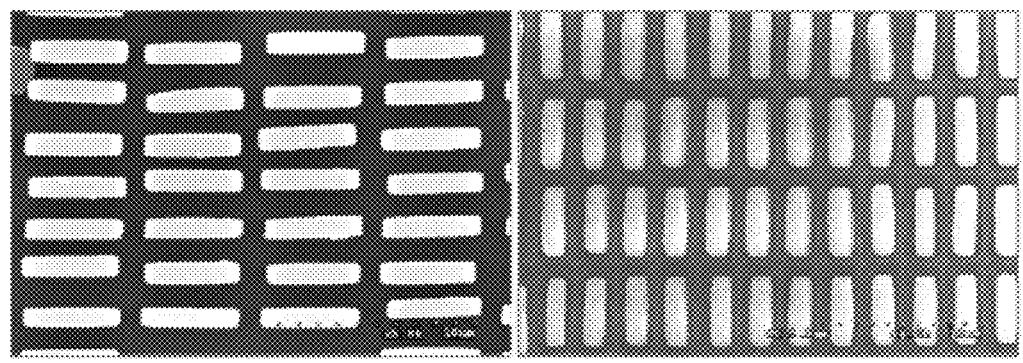

FIG. 31 is SEM images showing the assemblies of crystalline silica particles with a-, b- and c-axes inserted in silicone wafers negatively patterned with PR, left after PR removal by calcination.

DETAILED DESCRIPTION OF THE INVENTION

Hereinafter, the present invention will be described with reference to the following examples but is not limited thereto.

Examples

Experimental Methods

Throughout the specification, a percentage (%) used to represent the concentration of a material is wt/wt % unless stated otherwise.

<Preparation of Silica Beads>

A solution of tetraethylorthosilicate (TEOS, 20 ml, Aldrich) in ethanol (350 ml) was hydrolyzed in the presence of $NH_4OH$ (35%, 75 ml) at room temperature to prepare 20 to 1000-nm sized silica beads according to the Stober method (Stober, W. et al., Journal Interface Science 26:62-69 (1968)). The sizes of the silica particles were adjusted by changing the concentrations of TEOS and $NH_4OH$. For example, for the preparation of 500 nm sized silica beads, 20 ml TEOS was added to a solution containing 350 ml ethanol and 75 ml 35% $NH_4OH$, and the resultant solution was stirred at room temperature for three hours. In order to increase the size of silica beads from 500 nm to 700 nm, 16 ml TEOS and 8 ml $NH_4OH$ were simultaneously dropwise added to a solution containing 500 nm sized silica beads. For the preparation of smaller sized silica beads, TEOS and $NH_4OH$ were used in smaller amounts.

The silica beads thus produced were washed with ethanol (×3) and then with water (×3).

The washed silica beads were lyophilized. The standard size deviation of the resultant silica beads was 2%.

<Preparation of Substrates Surface-Coated with an Adhesive>

Glass plates (2.5 cm×2.5 cm, Marienfield) were placed in a piranha solution (a ratio of $H_2SO_4$ to $H_2O_2$=7:3) for 30 minutes and washed with deionized water. The washed glass plates were incubated in ethanol and then dried under highly pure nitrogen atmosphere. The dried glass plates were spin-coated with polyethyleneimine (PEI, Mw=25000, Aldrich). The spin coating was started at a spinning speed of 600 rpm, with gradual increase to 1000 rpm for one minute.

For monolayer assembly of silica beads, the concentration of PEI was 0.0625% for 20-nm sized silica beads, 0.125% for 200~300 nm sized silica beads, and 0.5% for 700~1000 nm sized silica beads.

<Preparation of Directly Patterned Substrates>

Tetragonal or hexagonal net arrays of nanowells or nanocones were formed on silicone wafers using lithography (NNFC (National NanoFab Center), Korea). The sizes of the silicone wafers used were 1 cm×1 cm. The diameters of the nanowells were 500 nm for 700 nm sized silica particles, 300 nm for 500 nm sized silica particles, and 200 nm for 300 nm sized silica particles. The depths of the nanowells were 250 nm. A well-to-well distance (pitch) was designed to be the same as the size of each of silica particles to be arrayed.

For example, in case of forming an array of 700 nm sized silica particle, a well-to-well distance is 700 nm. The nanocones were sized to have a bottom diameter of 250 nm, a top diameter of 200 nm and a height of 200 nm. The distance between adjacent ones of the nanocones was designed to be 700 nm for arrays of 700 nm sized silica particles.

<Preparation of Substrates Patterned with PR>

Silicone wafers (p-type) coated with patterned PR (tetragonal or hexagonal net arrays of nanowells) were prepared (NNFC, Korea). The wafers were sized to have an area of 1 cm×1 cm. The diameters of the nanowells formed in the PR were 500 nm, 300 nm and 200 nm for 700 nm, 500 nm and 300 nm sized silica beads, respectively. The depths of the nanowells were 250 nm regardless of the diameters of the nanowells.

<Arrangement of Particles Using Rubbing>

In case of using the patterned silicone wafers and glass plates, a small amount (2 mg) of powdered silica beads were placed on PEI-coated substrates (glass plates or patterned silicone wafers), and the silica beads were repeatedly gently rubbed in predetermined directions using PDMS (poly(dimethysiloxane)) plates (4.0×4.0×0.5 $cm^3$). The rubbing was performed for about one minute until a substrate surface got slight rainbow colors by light reflection.

In case of using the patterned PR-coated silicones wafers, the powdered silica beads were placed on the patterned PR-coated wafers, and then repeatedly gently rubbed in a predetermined direction using a PDMS plate in the presence of water. Here, water was used as a lubricant to prevent damage to the patterned PR.

<Formation of Monolayer Arrays>

After the rubbing, the silica bead-coated glass plates or silicone wafers were subjected to slight pressing using clean PDMS plates or to gentle brushing in order to remove randomly physically adsorbed, undesired silica beads, thus resulting in formation of more tightly, regularly bound monolayer arrays of the silica beads.

<Formation of Multilayer Arrays 1>

For layer-by-layer stacking, the above-formed monolayer arrays were calcined at 550° C. for one hour. A droplet of a solution of PEI (0.5%) in ethanol was spin-coated on the calcined silica bead arrays. Silica beads were further placed on the PEI-coated silica bead arrays, and then were rubbed as described above to form two-layered silica bead arrays. Through the repetition of the above-described procedure, it was possible to form 3D arrays of silica beads with a desired number of layers (i.e., a desired thickness).

<Formation of Multilayer Arrays 2>

The above-formed monolayer arrays were calcined at 550° C. for one hour. A droplet of a solution of PEI (0.5%) in ethanol was spin-coated on the calcined silica beads (200 nm). PMMA polymer balls (700 nm) were stacked on the PEI-coated silica bead monolayers using rubbing. Then, PEI coating was applied thereto and silica beads were further stacked thereon by rubbing (FIG. 23). Then, the PMMA polymer balls were removed by calcinations to thereby form a snowman-like layered array of silica beads (FIG. 24). Through the repetition of the above-described procedure, it was possible to form 3D arrays of silica beads with a desired number of layers (i.e., a desired thickness).

Experimental Results

Silica beads (20 nm to 1 μm in diameter) were prepared. Glass plates (2.5×2.5, 15×15 $cm^2$ in area) and patterned silicone wafers (1.0×1.0 $cm^2$ in area) were used as substrates. For the patterned silicone wafers, silicone wafers were patterned with tetragonal or hexagonal net arrays of 250-nm depth nanowells of 200 nm and 300 nm in diameter and pitch, of 350 nm and 500 nm in diameter and pitch, and of 500 nm and 700 nm in diameter and pitch. Also, there were prepared silicone wafers coated with 350-nm thick PR patterned with tetragonal or hexagonal net arrays of wells of 200 nm and 300 nm in diameter and pitch, of 350 nm and 500 nm in diameter and pitch, and of 500 nm and 700 nm in diameter and pitch. Also, there were prepared silicone wafers patterned with tetragonal arrays of truncated cone pillars (200 nm in top diameter, 250 nm in bottom diameter, 700 nm in pitch, and 250 nm in height), and silicone wafers patterned with tetragonal net arrays of cylindrical PR pillars (300 nm, 700 nm in pitch, 350 nm in height, 200 nm in diameter). Hereinafter, the substrates will be described as "symmetry-pattern shape-(pattern dimensions, i.e., a diameter of a well/cylinder or a bottom diameter of a cone/a pitch)-material". Here, the symmetry is T (tetragonal) or H (hexagonal), the pattern shape is Wel (wells), Cyl (cylinders), or Con (cones), and the material is Si (silicone) or PR/Si (PR-coated silicone). The number of the patterns for each substrate were as follows: T-Wel-(500/700)-Si: 14,286×14,286 ($2.0×10^8$); H-Wel-(500/700)-Si: 14,286×16,496 ($2.4×10^8$); T-Wel-(350/500)-Si: 20,000×20,000 ($4.0×10^8$); H-Wel-(350/500)-Si: 20,000×23,094 ($4.6×10^8$); T-Wel-(200/300)-Si: 33,333×33,333 ($11.1×10^8$); H-Wel-(200/200)-Si: 33,333×38,490 ($12.8×10^8$).

Figure 1:
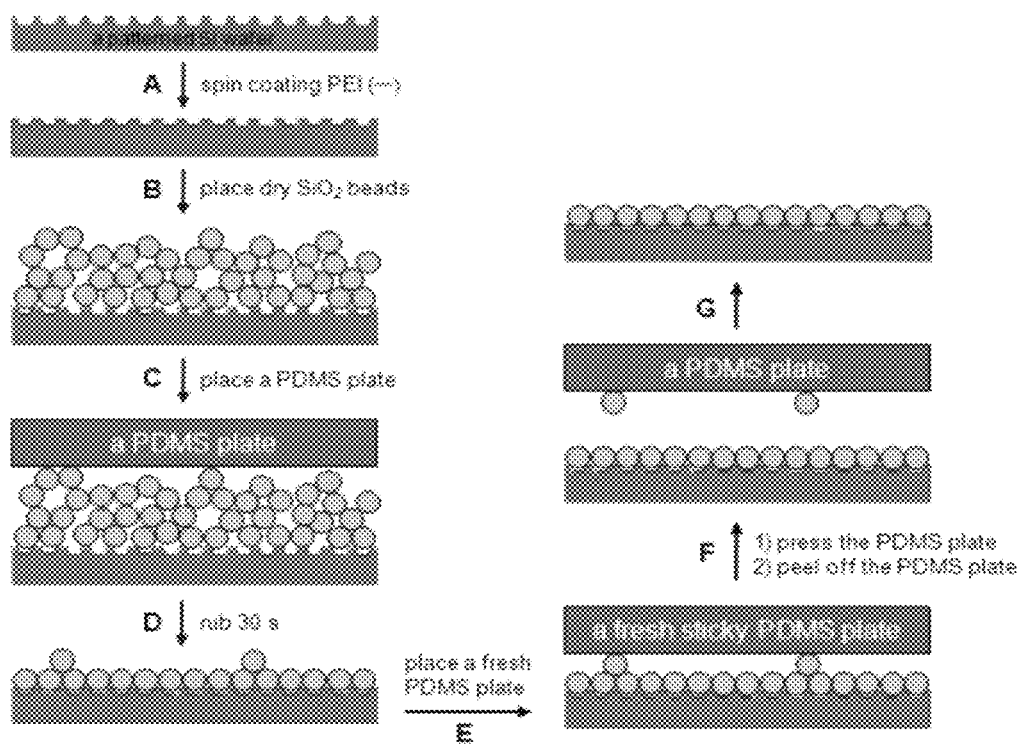
FIG. 1 is a flow diagram illustrating an embodiment of the first method of the present invention.
Figure 3:
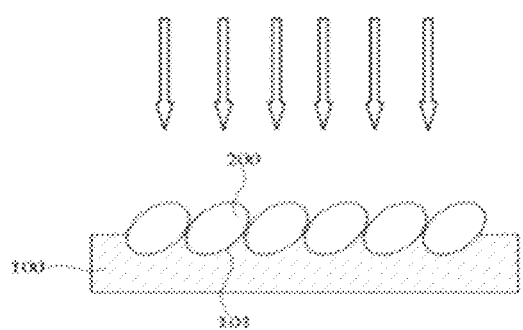
FIG. 3 is a diagram illustrating the insertion and arrangement of particles 200 in a predetermined orientation in patterned depressions 101 of a substrate 100. Here, arrows represent modification such as chemical treatment.
Figure 4:
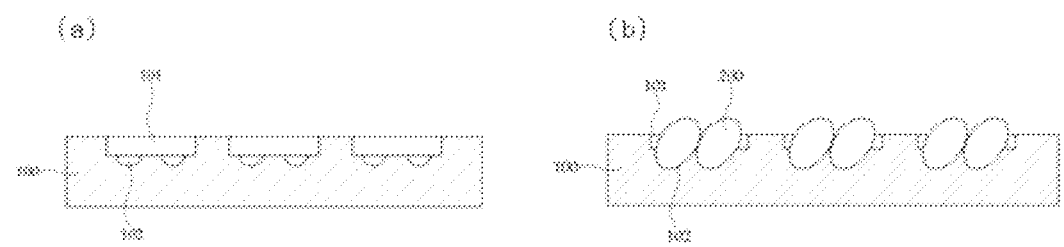
FIG. 4(a) is a diagram illustrating first depressions 101 and second depressions 102 patterned on a substrate.
FIG. 4(b) is a diagram illustrating the arrangement of particles 200 in first and second depressions 101 and 102 patterned on a substrate 100.
Figure 5:
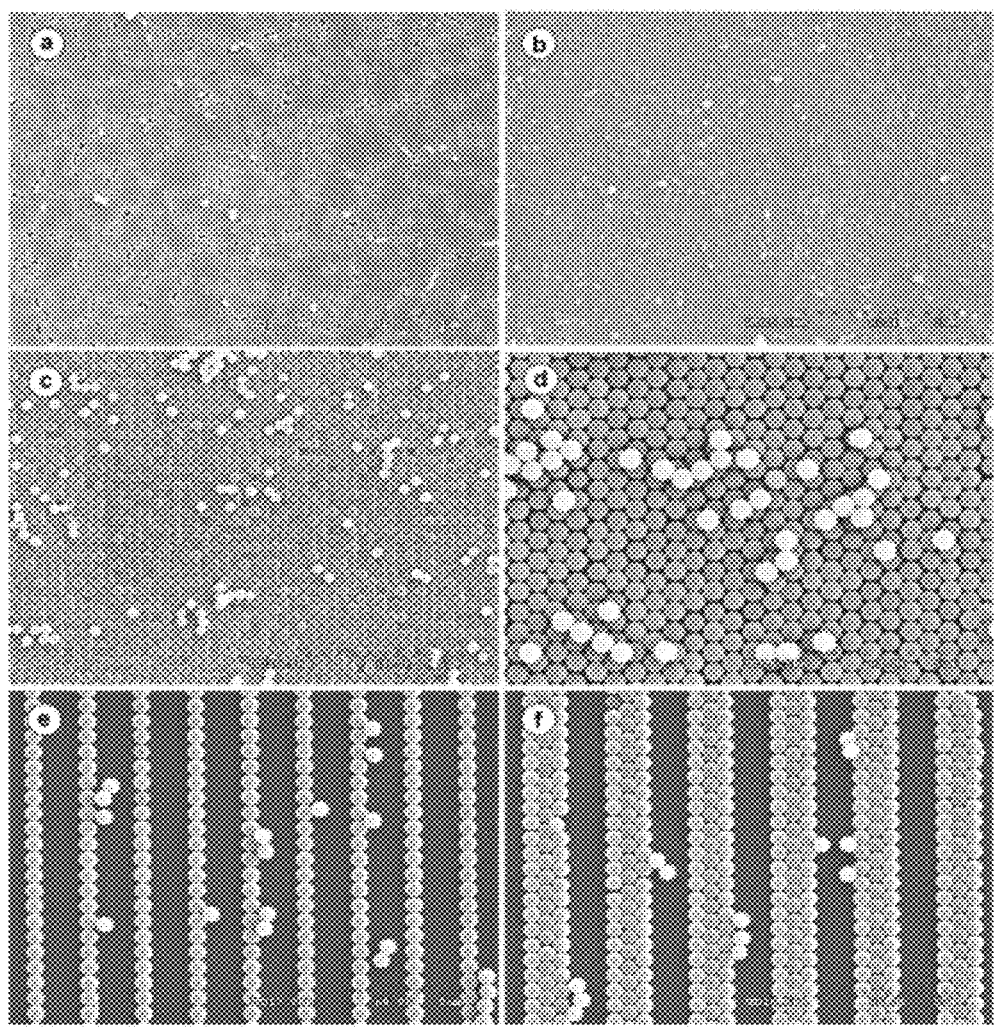
FIG. 5 is scanning electron microscopic (SEM) images showing undesired silica beads randomly attached onto 1D or 2D arrays of silica beads formed on PEI-coated glass plates by rubbing (panel (a): a 2D monolayer array of 1 μm sized silica beads (1K magnification); panel (b): a 2D monolayer array of 20 nm sized silica beads (20K magnification); panel (c): a fcc (100) array of 300 nm sized silica beads (8K magnification); panel (d): a fcc (100) array of 700 nm sized silica beads (8K magnification); panel (e): a 1D wire parallel array of 700 nm sized silica beads (6K magnification); and panel (f): a 1D stripe parallel array of 700 nm sized silica beads (6K magnification).
Figure 6:
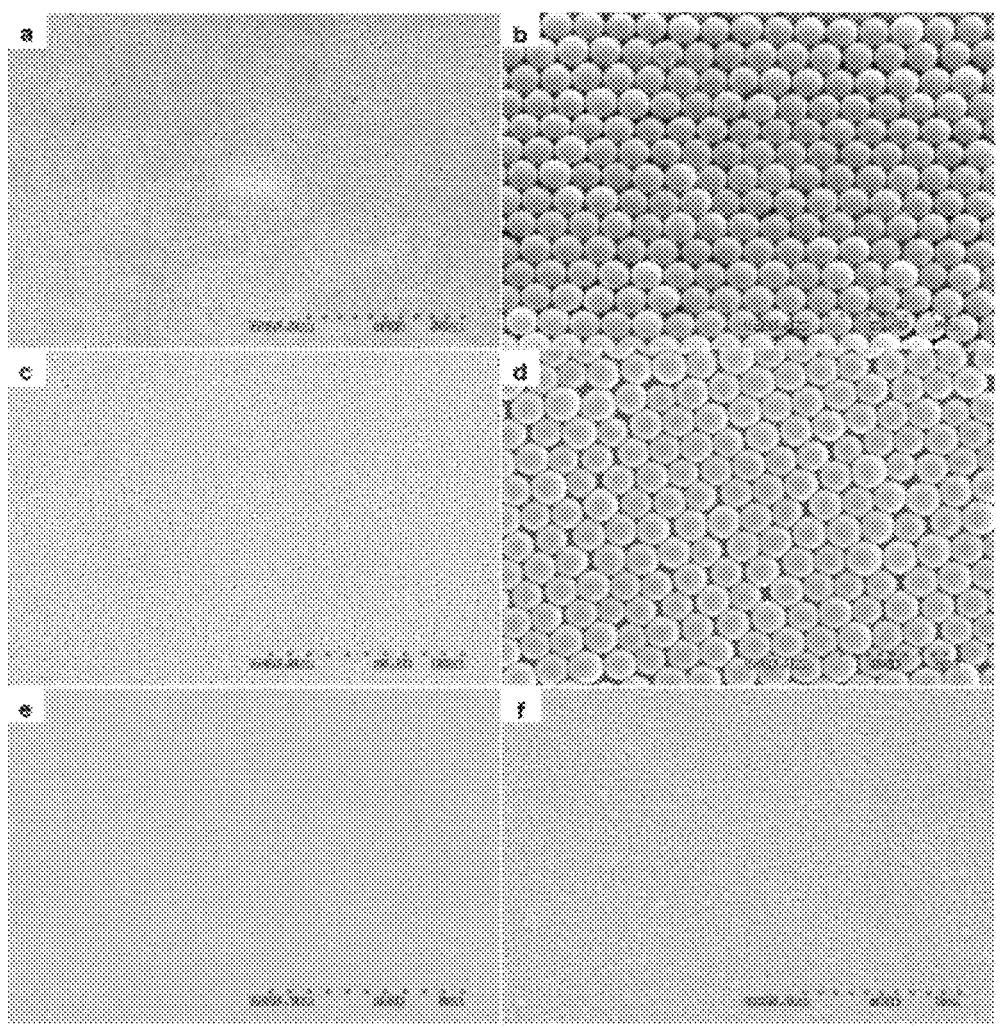
FIG. 6 is SEM images showing monolayer arrays of silica beads formed on flat glass plates by rubbing (panel (a): 1 μm sized silica beads under 0.8K magnification; panel (b): 1 μm sized silica beads under 7K magnification; panel (c): 200 nm sized silica beads under 5K magnification; panel (d): 200 nm sized silica beads under 35K magnification; panel (e): 20 nm sized silica beads under 10K magnification; panel (f): 20 nm sized silica beads under 40K magnification).

A small amount (2 mg) of dried 1 μm sized silica beads were placed on PEI-coated glass plates (2.5×2.5 $cm^2$), and the silica beads were repeatedly gently rubbed in one direction using a PDMS plate (4.0×4.0×0.3 $cm^3$) for about 30 seconds until surfaces of the glass plates got slight rainbow colors by light reflection. As shown in SEM images of FIG. 5, it was observed that some silica beads were undesirably randomly arranged on 2D monolayer arrays. When PDMS plates were placed and gently pressed on the randomly arranged silica beads, the randomly arranged silica beads were easily removed, thus resulting in high-quality 2D monolayer arrays of silica beads on the whole surfaces of the glass plates (FIG. 6, panels (a) and (b)). Therefore, unlike conventional self assembly in solvents, there were no needs to dry the resultant monolayers, thus eliminating crack formation due to particle shrinkage during drying.

Figure 7:
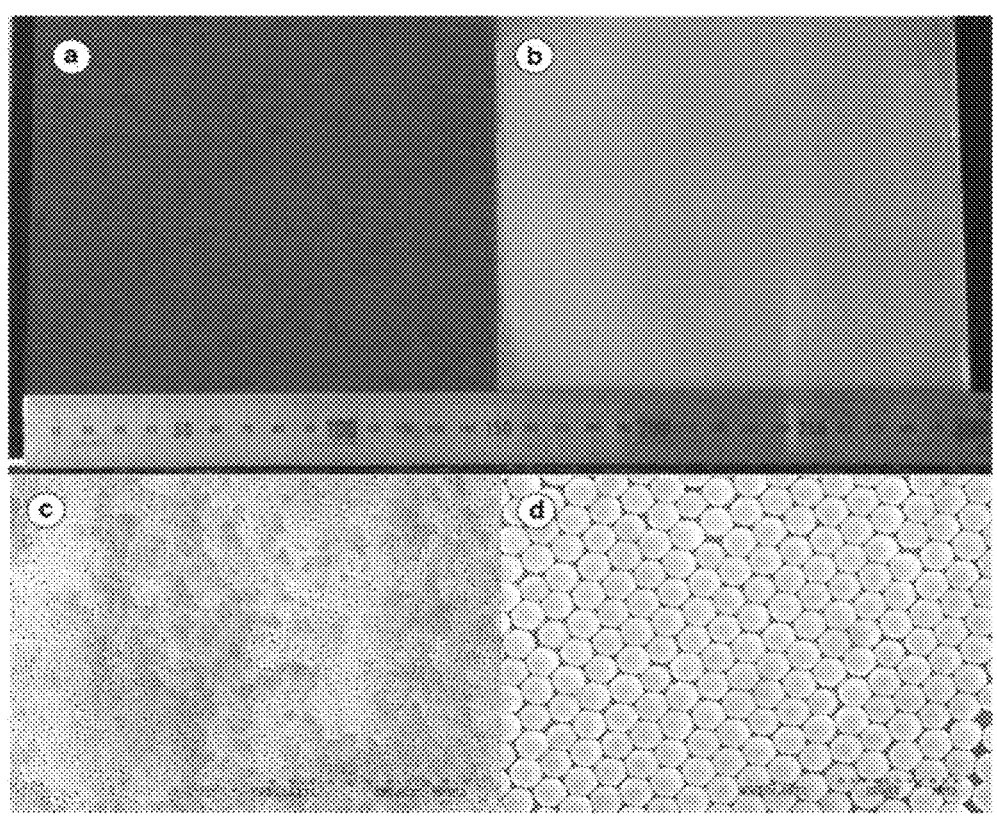
FIG. 7 is images showing the efficiency of the inventive methods on large-scale substrates (15×15 cm$^2$) (panel (a): a digital camera image of a bare glass plate; panel (b): a digital camera image of a glass plate wholly coated with 2D monolayer array of 1 μm sized silica beads; panel (c): a SEM image of the panel (b) under 2.5K magnification; and panel (d): a SEM image of the panel (b) under 15K magnification).
Figure 8:
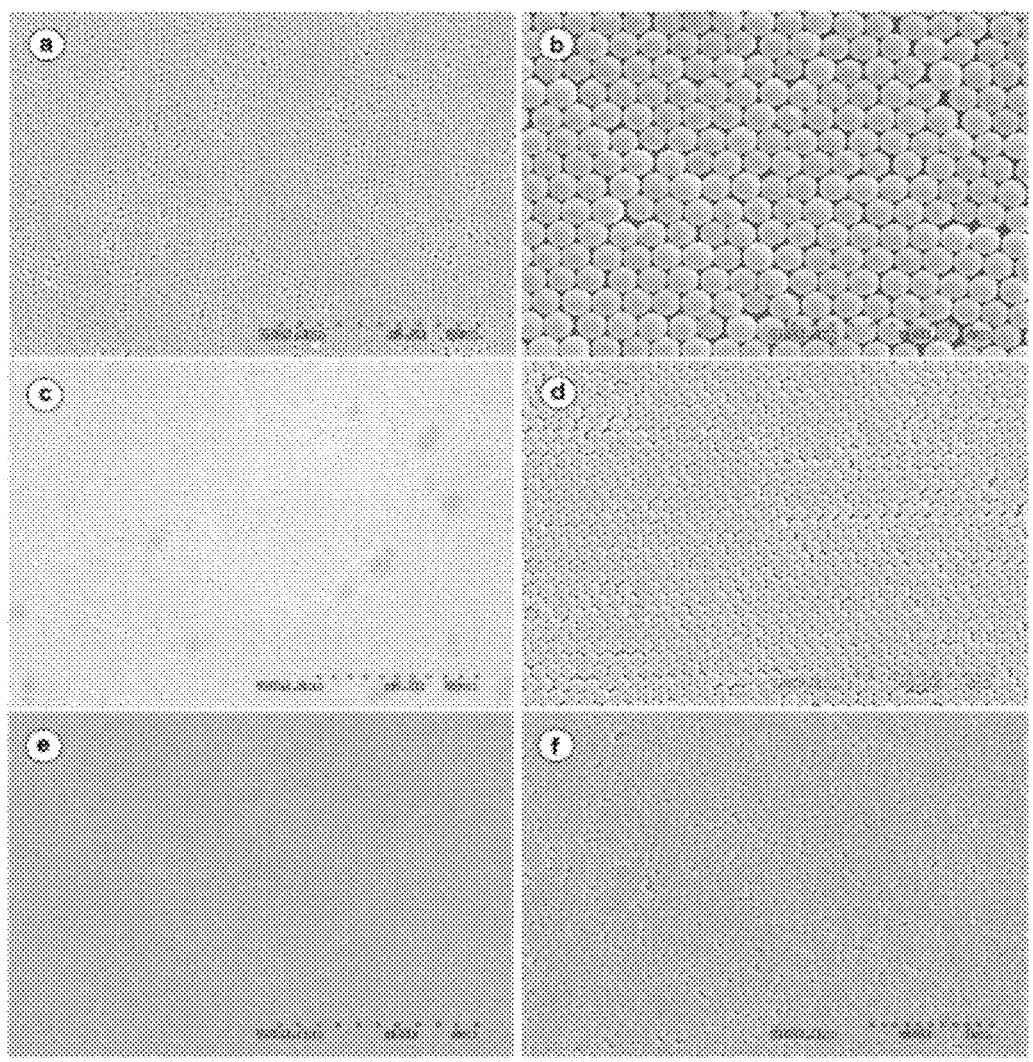
FIG. 8 is SEM images showing 2D monolayer arrays of silica beads on flat glass plates (panel (a): 700 nm sized silica beads under 2.5K magnification; panel (b): 700 nm sized silica beads under 10K magnification; panel (c): 500 nm sized silica beads under 2K magnification; panel (d): 500 nm sized silica beads under 7K magnification; panel (e): 20 nm sized silica beads under 10K magnification; and panel (f): 20 nm sized silica beads under 30K magnification). For the arrays of 700 nm and 500 nm sized silica beads, a 0.125% PEI solution was spin-coated on the glass plates. For the arrays of 20 nm sized silica beads, a 0.0625% PEI solution was spin-coated on the glass plates.

For very large (15×15 $cm^2$) substrates, the same effects as described above were achieved (FIG. 7). The use of smaller silica beads, i.e., 700-nm sized silica beads (FIG. 8), 500-nm sized silica beads (FIG. 8), 200-nm sized silica beads (FIG. 6, panels (c) and (d)), 60-nm sized silica beads (FIG. 8) and 20-nm sized silica beads (FIG. 6, panels (e) and (f)) also enabled to achieve excellent effects as described above. These results suggest that the inventive methods are very effective regardless of particle sizes.

Figure 9:
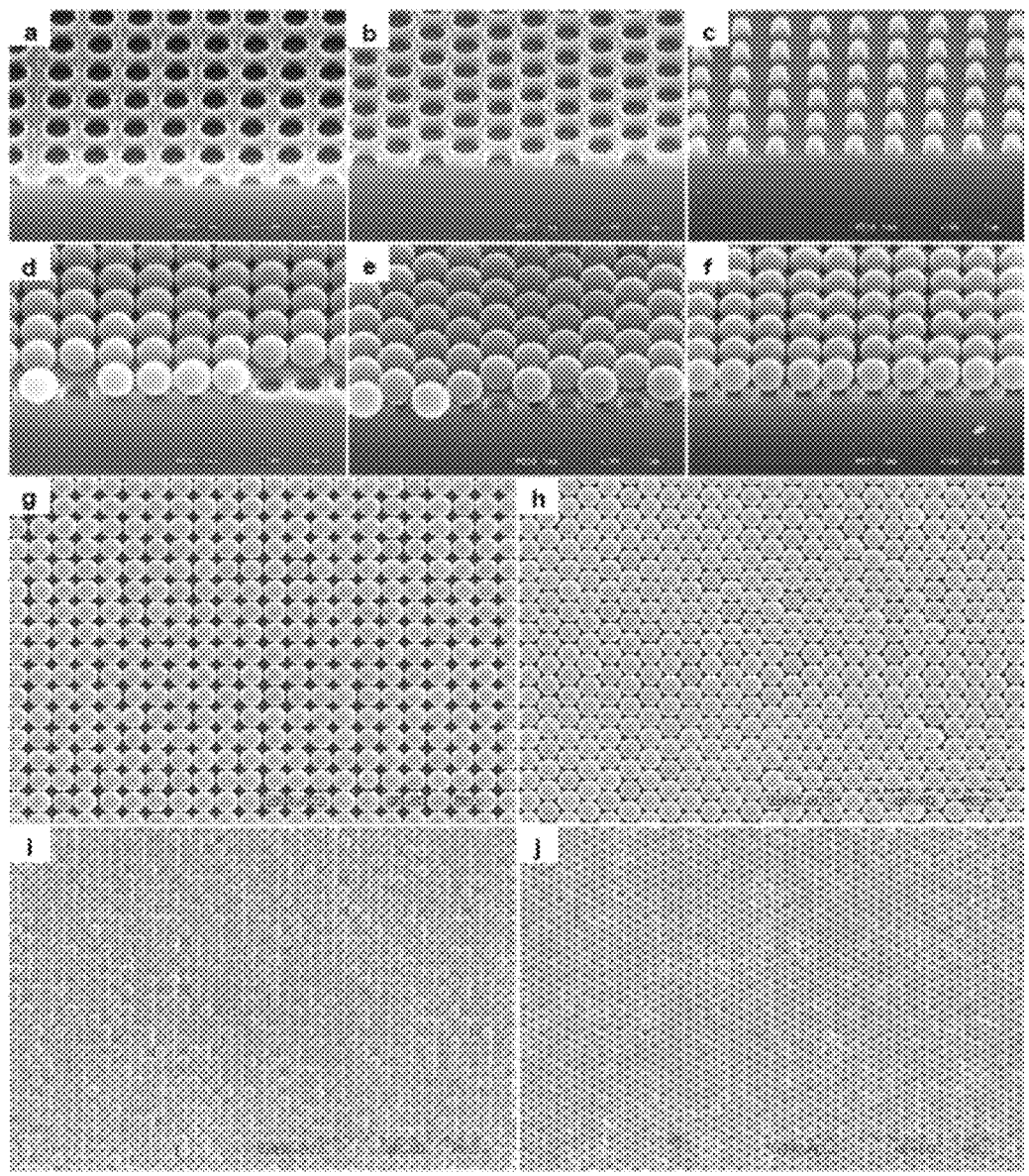
FIG. 9(a), (b), and (c) are SEM images showing silicone wafers patterned with nano-sized 2D arrays (panel (a): a tetragonal well array with 500 nm in diameter, 250 nm in depth and 700 nm in pitch; panel (b): a hexagonal well array with 250 nm in depth and 200 nm in top diameter; panel (c): a 2D array of truncated cones with 250 nm in bottom diameter). The arrays of the panels (a), (b) and (c) were respectively used as templates for 2D fcc (100) (panel (d)), fcc (111) (panel (e)) and fcc (100) (panel (f)) arrays of 700 nm sized silica beads. The panel (g) is a 2D fcc (100) array of 700 nm sized silica beads and the panel (h) is a 2D fcc (111) array of 700 nm sized silica beads [panels (a) to (f); 20K magnification, panels (g) to (j); 8K magnification].
Figure 10:
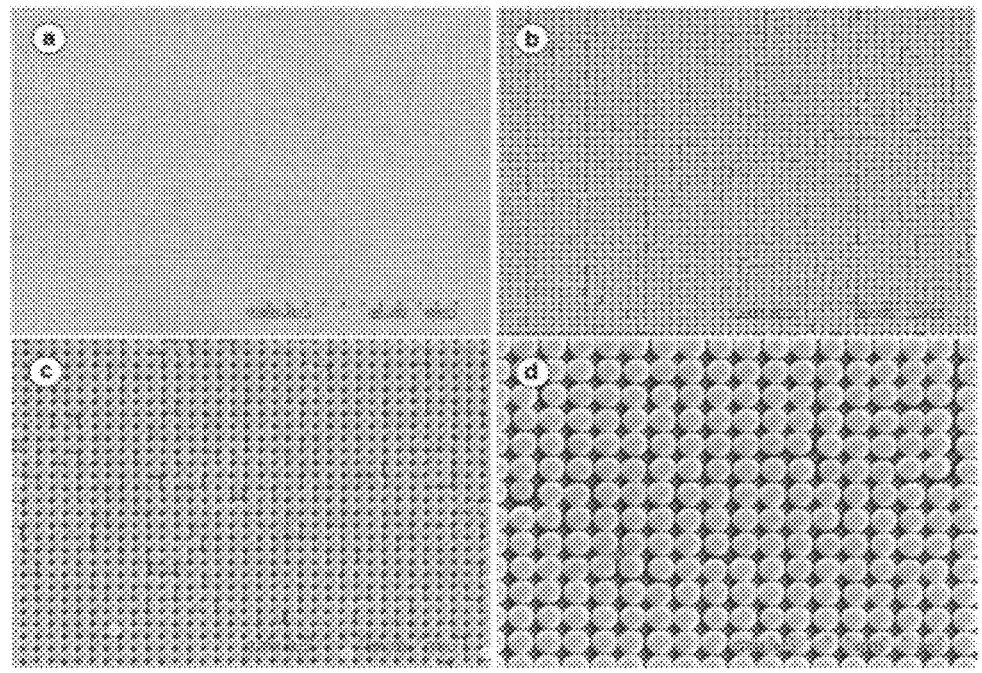
FIG. 10 is SEM images showing 2D fcc (100) monolayer arrays of 700 nm sized silica beads on patterned silicone wafers (1 cm×1 cm) (panel (a): 1K magnification; panel (b): 3K magnification; panel (c): 5K magnification; and panel (d): 10K magnification). A 0.25% PEI solution was spin-coated on the silicone wafers.

According to the same method as described above, monolayer arrays of 700-nm sized silica beads on patterned substrates, i.e., T-Wel-(500/700)-Si, H-Wel-(500/700)-Si, and T-Con-(250/700)-Si (FIG. 9, panels (a) to (c)) were manufactured. As a result, silica beads were accurately individually inserted in wells (FIG. 9, panels (d), (e)) or in spaces defined by adjacent four ones of truncated cones (FIG. 9, panel (f)), thereby resulting in perfect, fcc (100) and fcc (111) arrays of the silica beads. According to SEM analysis, silica beads formed prefect 2D monolayer arrays on the whole surfaces of the substrates (FIG. 9, panels (g), (h); FIGS. 10 to 15).

Similarly, for silica bead arrays on T-Wel-(300/500)-Si, H-Wel-(300/500)-Si, T-Wel-(200/300)-Si, and H-Wel-(200/300)-Si substrates (1.0×1.0 $cm^2$), perfect 2D fcc (100) and fcc (111) monolayer arrays of 500 nm (FIGS. 12, 13) and 300 nm (FIG. 9, panels (i), (j); FIGS. 14, 15) sized silica beads on the entire surfaces of the substrates were achieved. These results suggest that it is possible to form 2D silica bead monolayer arrays with symmetry and orientations based on a centimeter scale (up to 10-inch size) within one minute. Furthermore, thus-formed particle monolayers can have crystal-like arrays, and thus, assemblies of particles oriented in predetermined crystal axes can have optical characteristics, thereby enabling the application of them in the field of optical technology.

Figure 16:
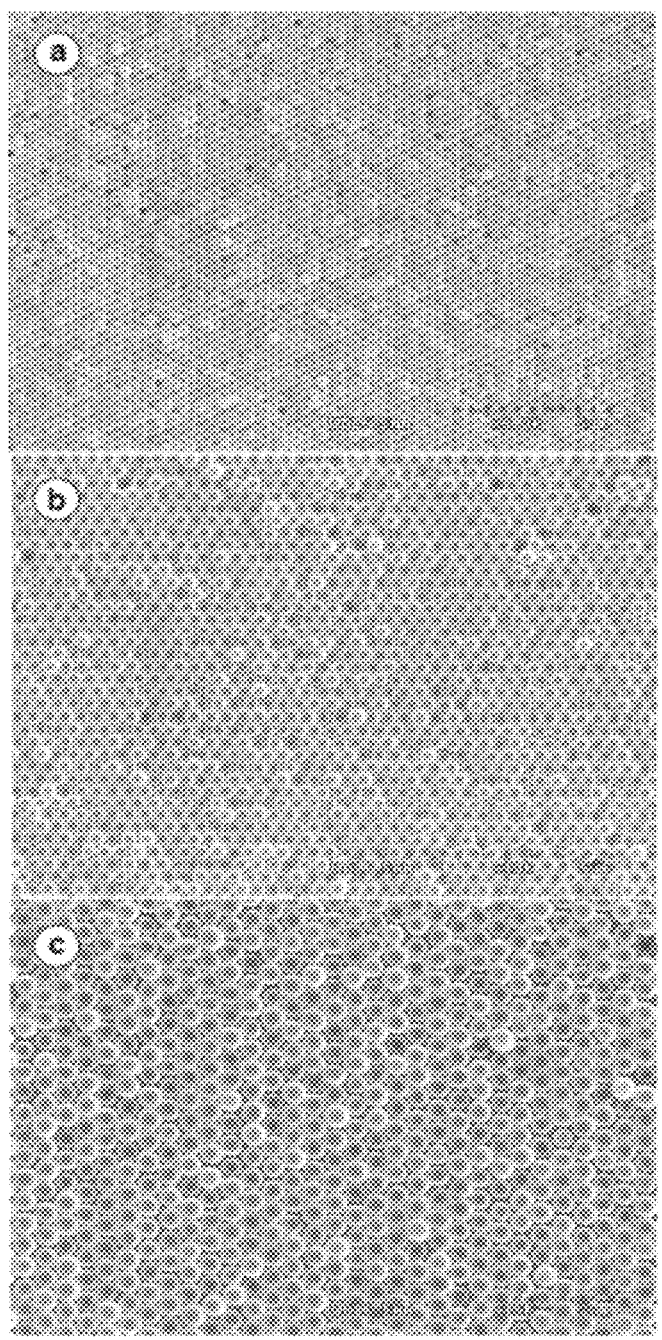
Figure 16:
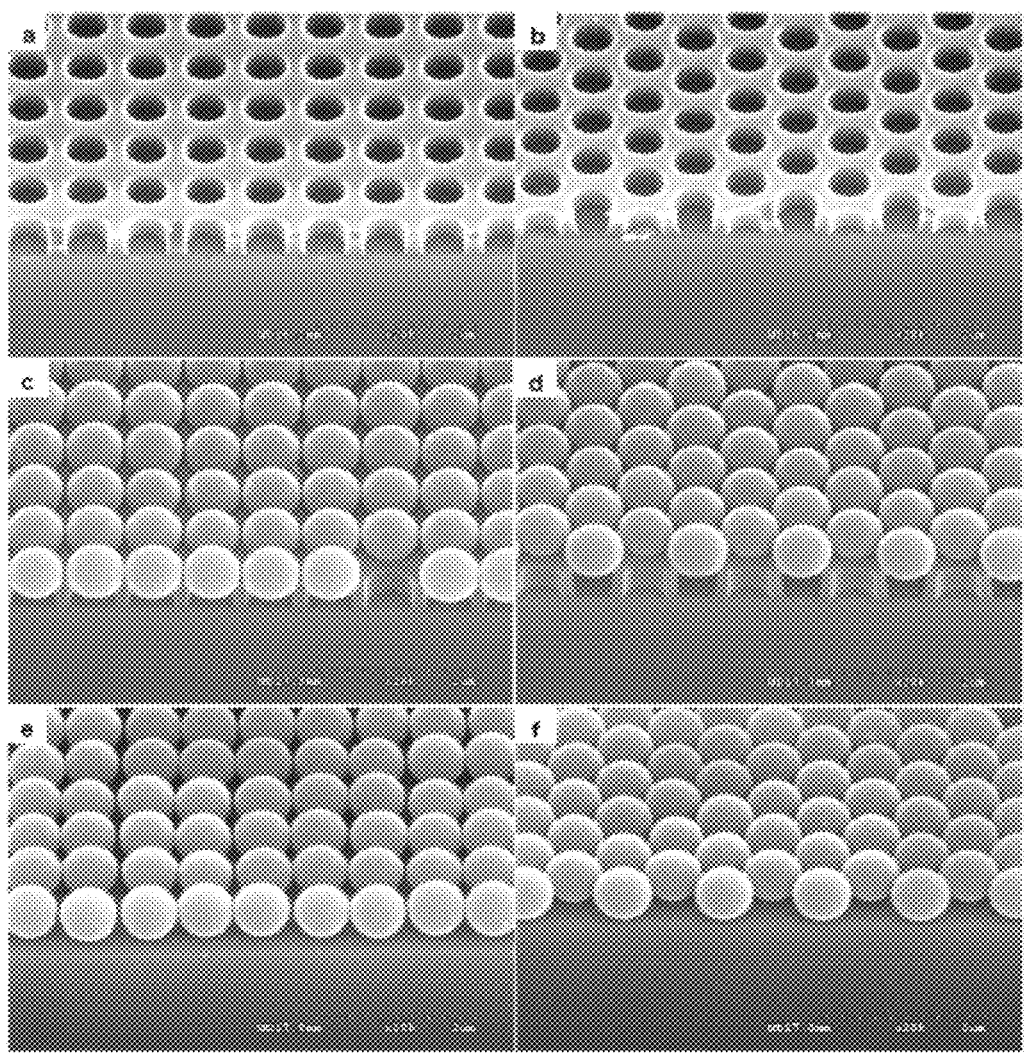

For patterned PR-coated silicone wafers, i.e., T-Wel-(500/700)-PR/Si (FIG. 16, panel (a)) and H-Wel-(500/700)-PR/Si (FIG. 16, panel (b)), high-quality, large-scale 2D monolayer arrays were also obtained (FIG. 16, panels (c), (d)). In this case, rubbing was more softly performed since the mechanical strength of PR is lower than that of silicone.

For PR-coated substrates, PR layers can be easily removed by methanol, and thus, it is possible to form free-standing 2D silica monolayers supported on flat substrates (FIG. 16, panels (e), (f)). This method can be used in formation of large-scale 2D monolayers of particles on various substrates.

Much attention has been paid to pattern-induced arrays of colloidal particles on a fcc (100) surface (A. van Blaaderen, R. Ruel, P. Wiltzius, Nature 1997, 385, 321; J. P. Hoogenboom, C. Re'tif, E. de Bres, M. van de Boer, A. K. van Langen-Suurling, J. Romijn, A. van Blaaderen, Nano Lett. 2004, 4, 205; Y. Yin, Y. Lu, B. Gates, Y. Xia, J. Am. Chem. Soc. 2001, 123, 8718). However, only substrates patterned with tetragonal net arrays of pillars (not wells) were effective (A. van Blaaderen, R. Ruel, P. Wiltzius, Nature 1997, 385, 321). In this case, 500×500 sites ($2.5×10^5$ sites) were imperfectly filled with silica beads, even when using substrates having areas 0.1% smaller than the areas of substrates used in the present invention. Moreover, it was impossible to form large-scale (1 $cm^2$) fcc (111) monolayer arrays even when using a patterned substrate.

According to the inventive methods, it was also possible to achieve 1D arrays, i.e., wire arrays (FIG. 17, panel (a)), fcc (100) stripe arrays (FIG. 17, panel (b)), fcc (111) stripe arrays (FIG. 17, panel (c)), and combination arrays thereof (FIG. 17, panel (d)).

It was also possible to achieve simultaneous 2D arrays into fcc (100) and fcc (111) lattice structures (FIG. 17, panel (e)).

Formation of different two types of symmetric arrays on only one substrate has not yet been achieved. Formation of 1D wires/stripes through self-assembly in solvents is known in the art (A. van Blaaderen, R. Ruel, P. Wiltzius, Nature 1997, 385, 321; J. P. Hoogenboom, C. Re'tif, E. de Bres, M. van de Boer, A. K. van Langen-Suurling, J. Romijn, A. van Blaaderen, Nano Lett. 2004, 4, 205; Y. Yin, Y. Lu, B. Gates, Y. Xia, J. Am. Chem. Soc. 2001, 123, 8718). However, lateral ordering of silica beads in 1D arrays has not yet been reported.

When repeatedly forming the fcc (100) arrays of the same-sized silica beads on substrates (1 $cm^2$) according to the inventive methods, it is possible to achieve perfect 3D fcc arrays grown in the [100] direction. This result is seen by panel (f) of FIG. 17 (use of 700 nm sized silica beads).

After calcining a first layer of a close-packed array of 700 nm sized silica beads on a T-Wel-(500/700)-Si substrate, PEI coating, application of silica beads with a different size from the silica beads constituting the first layer, and rubbing enabled to easily produce a binary 2D, tetragonal net array of different sized silica beads. For example, when calcining the 2D monolayer arrays of 700 nm sized silica beads on T-Wel-(500/700)-Si substrates, and placing and rubbing 300 nm or 420 nm sized silica beads on the monolayers, 2D binary, tetragonal net arrays of 700 nm/300 nm (FIG. 19, panel (a)) and 700 nm/420 nm (FIG. 19, panel (b)) sized silica beads were obtained.

According to the present invention, it is possible to achieve 2D non-close packed arrays of 700 nm or less sized silica beads on T-Wel-(500/700)-Si substrates. This was demonstrated using 500 nm (FIG. 20) and 420 nm (FIG. 19, panel (c)) sized silica beads.

The insertion of silica beads in patterned wells with diameters that are the same as or greater than the sizes of the silica beads can be easily rapidly performed relative to the organization of silica beads into fcc (100) or fcc (111) arrays. Interestingly, when using 420 nm sized silica beads and 500 nm diameter wells, the silica beads could be located in internal sides of the wells through rubbing in one direction (FIG. 19, panel (c)). When using silica beads with smaller sizes, i.e., 300 nm, 250 nm and 230 nm, two (FIG. 19, panel (d)), three (FIG. 19, panel (e)) and four (FIG. 19, panel (f)) silica beads were inserted in each of 500 nm diameter wells. This shows that the inventive methods can more easily and rapidly achieve the array of colloidal particles as compared with the Xia et al. method employing self-assembly in solvents (Y. Yin, Y. Lu, B. Gates, Y. Xia, J. Am. Chem. Soc. 2001, 123, 8718).

It is interesting that, during rubbing according to the present invention, the application of strong force to silica bead particles induces deformation of wells and silica beads. For example, 500 nm diameter circular wells were deformed to an oval shape so that two 300 nm sized silica beads were received in each well. At this time, silica beads were also deformed to an oval shape. The panel (f) of FIG. 19 shows that the wall thickness of 500 nm diameter wells was thinner so that four 230 nm-sized silica beads were received in each well. These results suggest that wells can receive silica beads sized about 10% larger than a well diameter by natural deformation, and thus, the inventive methods are more flexible than conventional self-assembly in terms of the sizes and shapes of particles.

The above-described experimental results demonstrate the excellent effects of the present invention, i.e., simple, rapid, and precise arrays on a large-scale area.

While the present invention has been particularly shown and described with reference to exemplary embodiments thereof, it will be understood by those of ordinary skill in the art that various changes in form and details may be made therein without departing from the spirit and scope of the present invention as defined by the following claims.

DESCRIPTION OF REFERENCE NUMERALS

| | |
|---|---|
| 100: | substrate, |
| 101: | first depression |
| 102: | second depression, |
| 200: | particle, |
| A: | adhesive material |

What is claimed is:

1. A method of arranging colloidal particles on a substrate, the method comprising:
    (a) preparing a substrate, a surface of which has depressions or projections defining pores capable of fixing the positions and/or orientations of one or more colloidal particles;
    (b) randomly placing on the substrate, a first plurality of dry colloidal particles in the absence of any solvent; and physically pressing the particles to provide immobilized particles and residual particles, wherein a portion or the whole of each of the immobilized particle is inserted in each of the pores, and the residual particles remain not immobilized on the substrate; and
    (c) removing the residual particles using an adhesive member,
    wherein the colloidal particles have sizes in a range of 10 nm-10 μm.

2. The method of claim 1, wherein the depressions or the projections are formed by direct printing by lithography, printing using photoresist, laser ablation after sacrificial layer coating, or inkjet printing.

3. The method of claim 1, wherein the pores have shapes corresponding to the shapes of predetermined portions of the particles to be inserted in the pores so that the particles are oriented in predetermined directions.

4. The method of claim 1, wherein the shapes of the depressions and the projections are nanowells, nanodots, nanopillars, nanotrenches or nanocones.

5. The method of claim 1, wherein the pores receiving the particles have two or more different sizes and/or shapes.

6. The method of claim 1, wherein each of the depressions of the substrate comprises two or more another depressions capable of individually fixing the positions and/or orientations of the particles therein.

7. The method of claim 1, wherein the pores of the substrate form a predetermined pattern or shape, and the immobilized particles inserted into the pores form a pattern corresponding to the predetermined pattern or shape.

8. The method of claim 1, wherein a particle inserted in a pore and another particle inserted in an adjacent pore are contacted with or separated from each other by adjusting a distance between the pores.

9. The method of claim 1, further comprising:
    (d) placing a second plurality of colloidal particles on a monolayer formed by the first plurality of colloidal particles after step (c) and physically pressing the particles so that the particles are inserted into interstitial spaces defined by adjacent three or more of the particles constituting the monolayer.

10. The method of claim 9, wherein step (d) is performed once or more to form a two or more-layered array.

11. The method of claim 1, further comprising:
    (e) coating or filling with a transparent or opaque protecting material, after step (c).

12. The method of claim 1, wherein some particles are different in size or shape from some other particles, and whereby the first plurality of the particles are separated corresponding to the size or shape of the pores.

13. The method of claim 1, further comprising modifying exposed portions of the particles present in the pores.

14. A method of arranging colloidal particles on a substrate, the method comprising:
    (a) preparing a substrate having one or more adhesive surface portions;
    (b) randomly placing on the substrate, a plurality of dry colloidal particles in the absence of any solvent, wherein said dry colloidal particles do not have flat facets but curved surfaces, and physically pressing the particles so that the particles are immobilized on adhesive surface portions of the substrate; and
    (c) removing residual particles randomly placed on the particle array of step (b), which are not immobilized on the substrate, using an adhesive member, wherein the colloidal particles have sizes in a range of 10 nm-10 μm.

15. The method of claim 14, wherein the adhesive surface portions of the substrate form a predetermined pattern or shape so that the particles immobilized on the adhesive surface portions of the substrate form a pattern or shape corresponding to the predetermined pattern or shape of the adhesive surface portions.

16. The method of claim 14, wherein the particles and/or the substrate are surface-coated with an adhesive material.

17. The method of claim 16, further comprising: removing the adhesive material coated on the particles and/or the substrate, after step (c).

\* \* \* \* \*